(12) United States Patent
Hallberg et al.

(10) Patent No.: US 9,614,479 B2
(45) Date of Patent: Apr. 4, 2017

(54) CLASS-B/C DOHERTY POWER AMPLIFIER

(71) Applicant: Telefonaktiebolaget L M Ericsson (publ), Stockholm (SE)

(72) Inventors: William Hallberg, Mölndal (SE); Mustafa Özen, Göteborg (SE); Christian Fager, Mölnlycke (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/759,528

(22) PCT Filed: Jul. 1, 2015

(86) PCT No.: PCT/EP2015/064919
§ 371 (c)(1),
(2) Date: Jul. 7, 2015

(65) Prior Publication Data
US 2017/0005620 A1 Jan. 5, 2017

(51) Int. Cl.
*H03F 1/02* (2006.01)
*H03F 3/193* (2006.01)
*H03F 3/21* (2006.01)

(52) U.S. Cl.
CPC ........... *H03F 1/0288* (2013.01); *H03F 3/193* (2013.01); *H03F 3/211* (2013.01); *H03F 2200/451* (2013.01); *H03F 2203/21106* (2013.01)

(58) Field of Classification Search
USPC .......... 330/124 R, 295, 84, 286, 53
See application file for complete search history.

(56) References Cited

U.S. PATENT DOCUMENTS 9,154,094 B2 * 10/2015 Mohamed ............... H03F 3/602
2004/0145416 A1 7/2004 Kwon et al.

FOREIGN PATENT DOCUMENTS

WO 2015055242 A1 4/2015

OTHER PUBLICATIONS

Linner, P., "Unified Electronic Circuit Simulation: Theory and Design", Section 5.5.2: Synthesis of reciprocal networks, Chalmers University of Technology, Jan. 1, 2010, p. 131.
(Continued)

*Primary Examiner* — Hieu Nguyen
(74) *Attorney, Agent, or Firm* — Coats & Bennett, P.L.L.C.

(57) ABSTRACT

It is provided an amplifier arrangement for optimizing efficiency at a peak power level and a back-off power level γ. The amplifier arrangement comprises an input power splitter dividing an input signal into a first signal having a power $P_m$ and a second signal having a power $P_a$, a main transistor operating in a class-B like mode receiving the first signal, an auxiliary transistor operating in a class-C mode receiving the second signal. The received first and second signals have a phase offset value θ, wherein $-\pi<\theta<\pi$. The amplifier arrangement further comprises a combining network. Circuit element values of the combining network, the power $P_m$ and the power $P_a$, the phase offset value θ, a bias condition of the auxiliary transistor; and a relative size $S_{aux}$ of the auxiliary transistor, are based on a predetermined back-off power level γ, a current scaling factor $r_c$ of the auxiliary transistor, a main transistor oversizing factor $r_{o,m}$, and an auxiliary transistor oversizing factor $r_{o,a}$, where $r_c<1$, $r_{o,m}\geq 1$ and $r_{o,a}\geq 1$. It is also provided a method for determining properties for an amplifier arrangement.

23 Claims, 15 Drawing Sheets

(56) References Cited

OTHER PUBLICATIONS

Kim, J., et al., "Optimum Operation of Asymmetrical-Cells-Based Linear Doherty Power Amplifiers—Uneven Power Drive and Power Matching", IEEE Transactions on Microwave Theory and Techniques, May 1, 2002, pp. 1802-1809, vol. 53, No. 5, IEEE.

Chireix, H., "High Power Outphasing Modulation", Proceedings of the Institute of Radio Engineers, 19365-11-01, pp. 1-23, vol. 23, No. 11.

Raab, F., "High-Efficiency Linear Amplification by Dynamic Load Modulation", IEEE MTT-S International Microwave Symposium Digest, Jun. 8, 2003, pp. 1717-1720, vol. 3, IEEE.

Iwamoto, M., et al., "An Extended Doherty Amplifier with high Efficiency Over a Wide Power Range", IEEE MTT-S International Microwave Symposium Digest, May 20, 2001, pp. 931-934, vol. 2, IEEE.

Özen, M., et al., "Symmetrical Doherty Amplifier with High Efficiency over Large Output Power Dynamic Range", IEEE MTT-S International Microwave Symposium (IMS), Jun. 1, 2014, pp. 1-4, IEEE.

Doherty, W., "A New High Efficiency Power Amplifier for Modulated Waves", Proceedings of the Institute of Radio Engineers, RFIC Virtual Journal, Sep. 1, 1936, pp. 1163-1182, vol. 24, Issue: 9, IEEE.

Linner, P. et al., "Unified Electronic Circuit Simulation: Theory and Design", Chapter 5: Linear Node Analysis, Jan. 1, 2008, pp. 128-135.

Collin, R., "Foundations for Microwave Engineering", Jan. 1, 2001, 2nd Edition, pp. 442-451, Wiley—IEEE Press.

Cripps, S., "Advanced Techniques in RF Power Amplifier Design", Jan. 1, 2001, pp. 42-49, IPF.

Yengst, W., "Procedures of Modern Network Synthesis", Jan. 1, 1964, pp. 164-221, Macmillan.

Bathich, K., et al., "A High Efficiency Si LDMOS Doherty Power Amplifier with Optimized Linearity," Microwave and Optoelectronics Conference (IMOC), 2009 SBMO/IEEE MTT-S International, IEEE, Piscataway, NJ, Nov. 3, 2009, pp. 33-36.

Gajadharsing, J., et al., "Analysis and Design of a 200W LDMOS Based Doherty Amplifier for 3G Base Stations," Microwave Symposium Digest, 2004, IEEE MTT-S International, Piscataway, NJ, IEEE, vol. 2, Jun. 9, 2004, pp. 529-532.

\* cited by examiner

CLASS-B/C DOHERTY POWER AMPLIFIER

TECHNICAL FIELD

The invention relates to an amplifier arrangement, a method, a computer program and a computer program product for determining properties of an amplifier arrangement.

BACKGROUND

Modern communication systems often employ signals with high peak to average power ratio (PAPR) to improve the spectral efficiency. The efficiency of traditional class-AB power amplifiers (PA) is however rapidly degraded when the output power is backed off from its maximum. The efficiency at back off may be improved by incorporating the power amplifier into special transmitter/PA architectures, such as Doherty, W. H. Doherty, "A New High Efficiency Power Amplifier for Modulated Waves," Proceedings of the Institute of Radio Engineers, vol. 24, no. 9, pp. 1163-1182, September 1936, out -phasing or dynamic load modulation. Due to its relative simplicity and high performance, the Doherty PA is widely adopted in commercial applications.

The fundamental principle of Doherty operation is to modulate the impedance seen by the main transistor via active current injection using an auxiliary transistor. Based on this principle, the peak efficiency can be maintained both at peak power and at the average power level of the signal, e.g. at 6.5 dB back-off.

The classical Doherty configuration ideally consists of one class-B biased transistor, from here on referred to as the main transistor, and one class-C biased transistor, from here on referred to as the auxiliary transistor, combined with a quarter wave transformer. The auxiliary transistor's class-C bias is selected such that the required current profiles are achieved. This configuration provides the ideal maximum efficiency (78.5%) of the class-B biased main transistor and the ideal maximum efficiency (>78.5%) of the class-C biased auxiliary transistor at peak power level. At a selected output power back-off (OPBO) from the peak power level, the ideal maximum efficiency is provided for the main transistor, while the auxiliary transistor is turned off. Originally, Doherty described current profiles resulting in a second efficiency peak at 6 dB OPBO. Fortunately, the current profiles can easily be generalized such that the second efficiency peak can be placed at any desired back-off level, $\gamma$. This generalized form of the Doherty configuration will be denoted as the classical Doherty power amplifier (DPA).

The classical DPA requires the auxiliary transistor to be larger than the main transistor to reach the desired current profiles. For instance, for $\gamma=6$ dB, when fully utilizing the auxiliary transistor, the auxiliary transistor must be 1.27 times larger than the main transistor, and for $\gamma=9$ dB, the auxiliary transistor must be 2.10 times larger than the main transistor.

The class-C biasing of the auxiliary transistor, together with the effect of the intrinsic parasitics scaling in proportion to the transistor size, result in asymmetrical power splitting into the two transistors. For small signals, when the auxiliary transistor is turned off, the input power split can directly be translated into gain loss; when the auxiliary transistor turns off, the power injected into the auxiliary transistor will just be wasted. Moreover, if the power division ratio of a splitter is very uneven, the resulting transmission lines become very thin and/or thick, putting a practical limitation on the realization of the splitter. In some cases, even attenuators are used to achieve the right power division ratio, badly degrading the power added efficiency (PAE), as disclosed by Jangheon Kim, et al., "Optimum operation of asymmetrical-cells-based linear Doherty power Amplifiers-uneven power drive and power matching," IEEE Transactions on Microwave Theory and Techniques, vol. 53, no. 5, pp. 1802-1809, May 2005.

A well-known method of reducing the small signal gain loss of the input power splitter is to make the auxiliary transistor larger than necessary and underutilize it. As the auxiliary transistor becomes bigger, the auxiliary bias approaches class-B bias. This isolated effect will result in a less asymmetrical input power split, but intrinsic parasitics scaling will lessen this effect severely. Even though an oversized auxiliary transistor DPA has somewhat lower combiner gain loss than a DPA with a fully utilized auxiliary transistor, substantial oversizing is often unpractical due to extrinsic parasitics and physical dimension constraints. Moreover, oversizing directly translates into higher cost. In real-life applications, a DPA with symmetrical or close to symmetrical transistors is often the preferred choice, as outlined in WO2015/055242 disclosing a symmetrical amplifier.

Other methods to improve the gain are to increase the main cell bias towards class-AB and/or reducing the size of the class-C cell without any compensation in the topology. Naturally, these solutions will violate the ideal operation of the circuit, significantly degrading the drain efficiency.

In power amplifier designs, PAE is one of the most important attributes; in order to reach high enough PAE, sufficient efficiency and gain is required. When approaching millimeter waves, low gain is a critical problem, making it very difficult designing a DPA with high enough PAE. Thus, a method of increasing the gain without increasing the chip size or compromising efficiency is highly sought-after.

SUMMARY

In view of above-mentioned and other drawbacks of the prior art, it is an object of the present invention to provide an improved amplifier arrangement for optimizing efficiency at a peak power level and a back-off power level $\gamma$, and a method for determining properties of such an amplifier arrangement.

According to a first aspect, it is provided an amplifier arrangement for optimizing efficiency at a peak power level and a back-off power level $\gamma$. The amplifier arrangement comprises an input power splitter configured to divide an input signal into a first signal having a power $P_m$ and a second signal having a power $P_a$, a main transistor connected to the power splitter and arranged to receive the first signal, the main transistor being configured to operate in a class-B like mode of operation to provide a first output signal, an auxiliary transistor connected to the power splitter and arranged to receive the second signal, the auxiliary transistor being configured to operate in a class-C mode of operation to provide a second output signal, wherein the received first and second signals have a phase offset value $\theta$, wherein $-\pi<\theta<\pi$; and a combining network configured to couple the first and second output signals of the main and auxiliary transistors to an output node of the amplifier arrangement. In the amplifier arrangement, circuit element values of the combining network, the power $P_m$ and the power $P_a$, the phase offset value $\theta$, a bias condition of the auxiliary transistor; and a relative size $S_{aux}$ of the auxiliary transistor, are based on a predetermined back-off power level γ, a current scaling factor $r_c$ of the auxiliary transistor, a main transistor oversizing factor $r_{o,m}$, and an auxiliary transistor oversizing factor $r_{o,a}$, where $r_c<1$, $r_{o,m}\geq 1$ and $r_{o,a}\geq 1$.

The technique disclosed herein is based on the realization that an amplifier arrangement with improved properties for a selected back-off power level γ can be achieved by scaling the current profile of the auxiliary transistor. Moreover, the current scaling may be combined with oversizing of the auxiliary transistor and/or oversizing of the main transistor. Based on the technique disclosed herein, amplifier solutions with significantly higher gain or smaller size can be identified.

According to some aspects, the current scaling factor $r_c$ is $$\frac{2}{\gamma+1} \leq r_c < 1,$$

where γ>1.

According to some further aspects $S_{aux}=r_{o,a}S_c/r_{o,m}$, where $S_c$ is a size ratio defined as $$S_c = r_c \frac{\pi}{2} \frac{(\beta_{bk}-1)^2}{\beta_{bk}\left(\cos^{-1}(\beta_{bk}) - \beta_{bk}\sqrt{1-\beta_{bk}^2}\right)},$$

and where $$\beta_{bk} = \frac{\sqrt{4r_c\gamma + (r_c-1)^2} - (r_c-1)}{2\gamma}.$$

According to some aspects the phase offset value θ is $$\theta = \begin{cases} \pm\theta_x \\ \pm(\pi-\theta_x) \end{cases},$$

where $$\theta_x = \tan^{-1}\left(\sqrt{\frac{\beta_{bk}+r_c}{1-r_c}}\right).$$

According to some aspects, the power splitter is configured to divide an input power $P_{in}$ as $P_m=d_{P,m}P_{in}$, where $$d_{P,m} = \frac{1}{1 + \frac{r_{o,m}}{r_{o,a}}\frac{S_c}{(\beta_{bk}-1)^2}}.$$

According to some aspects a gate bias $V_{GS,a}$ of the auxiliary transistor is $$V_{GS,a} = \frac{V_T - \beta_{bk}V_{SAT}U_{V,a}}{1-\beta_{bk}U_{V,a}},$$

where $V_T$ is the threshold voltage, $V_{SAT}$ is the saturation voltage and $$U_{V,a} = \frac{1}{\beta_{bk}(1-r_{o,a}) + r_{o,a}}.$$

According to some aspects, the combining network comprises a three port network comprising a first port connected to the output of the main transistor, a second port connected to the output of the auxiliary transistor, and a third port connected to the output node.

According to some aspects the circuit element values of the three port network are defined using a two port network model as $$Z_{11} = \frac{r_{o,m}R_{opt,m}}{\beta_{bk}},$$

$$Z_{12} = -\frac{r_{o,m}R_{opt,m}e^{j\theta}}{r_c}, \text{ and}$$

$$Z_{22} = \frac{r_{o,m}R_{opt,m}\beta_{bk}(r_c + e^{j2\theta})}{r_c^2(1-\beta_{bk})},$$

where $R_{opt}$ is the optimum class B load and where $Z_{21}=Z_{12}$.

According to some aspects, $r_c$, $r_{o,a}$ and $r_{o,m}$ are selected so that $S_{aux}=1$ for a predetermined back-off power level γ, for $r_{o,m}>1$, $r_{o,a}\geq 1$.

According to some aspects, $r_c$, $r_{o,a}$ and $r_{o,m}$ are selected so that $S_{aux}=1$ for a predetermined back-off power level γ, for $r_{o,m}\geq 1$, $r_{o,a}>1$.

According to some aspects, there is provided a circuit comprising the amplifier arrangement according to any of the above discussed aspects.

According to some aspects, there is provided a wireless communications device comprising the amplifier arrangement according to any of the above discussed aspects.

The object stated above is also obtained by a method of determining the properties of an amplifier arrangement for optimizing efficiency at a peak power level and a back-off power level γ. The amplifier arrangement comprises an input power splitter configured to divide an input signal into a first signal having a power $P_m$ and a second signal having a power $P_a$, a main transistor connected to the power splitter and arranged to receive the first signal, the main transistor being configured to operate in a class-B like mode of operation to provide a first output signal, an auxiliary transistor connected to the power splitter and arranged to receive the second signal, the auxiliary transistor being configured to operate in a class-C mode of operation to provide a second output signal, wherein the received first and second signals have a phase offset value θ, wherein $-\pi<\theta<\pi$; and a combining network configured to couple the first and second output signals of the main and auxiliary transistors to an output node of the amplifier arrangement. The method comprises determining circuit element values of the combining network, determining the power $P_m$ and the power $P_a$, determining the phase offset value θ, determining bias conditions of the auxiliary transistor, and determining a relative size $S_{aux}$ of the auxiliary transistor, based on a selected back-off power level γ, a current scaling factor $r_c$ and a main transistor oversizing factor $r_{o,m}$, and an auxiliary transistor oversizing factor $r_{o,a}$, where $r_c<1$, $r_{o,m}\geq 1$ and $r_{o,a}\geq 1$.

According to some aspects, the method comprises selecting the current scaling factor $r_c$ as $$\frac{2}{\gamma+1} \leq r_c < 1,$$

where $\gamma > 1$.

According to some aspects, the method comprises determining $S_{aux}$ as $S_{aux} = r_{o,a} S_c / r_{o,m}$, where $S_c$ is a size ratio defined as $$S_c = r_c \frac{\pi}{2} \frac{(\beta_{bk} - 1)^2}{\beta_{bk}\left(\cos^{-1}(\beta_{bk}) - \beta_{bk}\sqrt{1-\beta_{bk}^2}\right)},$$

and where $$\beta_{bk} = \frac{\sqrt{4 r_c \gamma + (r_c - 1)^2} - (r_c - 1)}{2\gamma}.$$

According to some aspects, the phase offset value $\theta$ is selected as $$\theta = \begin{cases} \pm \theta_x \\ \pm (\pi - \theta_x) \end{cases},$$

where $$\theta_x = \tan^{-1}\left(\sqrt{\frac{\beta_{bk} + r_c}{1 - r_c}}\right).$$

According to some aspects, the power splitter is configured to divide an input power $P_{in}$ as $P_m = d_{P,m} P_{in}$, where $$d_{P,m} = \frac{1}{1 + \frac{r_{o,m}}{r_{o,a}} \frac{S_c}{(\beta_{bk}-1)^2}}.$$

According to some aspects, the method comprises a gate bias $V_{GS,a}$ of the auxiliary transistor is selected as $$V_{GS,a} = \frac{V_T - \beta_{bk} V_{SAT} U_{V,a}}{1 - \beta_{bk} U_{V,a}},$$

where $V_T$ is the threshold voltage, $V_{SAT}$ is the saturation voltage and $$U_{V,a} = \frac{1}{\beta_{bk}(1 - r_{o,a}) + r_{o,a}}.$$

According to some aspects, the combining network comprises a three port network comprising a first port connected to the output of main transistor, a second port connected to the output of the auxiliary transistor, and a third port connected to the output node.

According to some aspects, the circuit element values of the three port network are determined using a two port network model as $$Z_{11} = \frac{r_{o,m} R_{opt,m}}{\beta_{bk}},$$

$$Z_{12} = -\frac{r_{o,m} R_{opt,m} e^{j\theta}}{r_c}, \text{ and}$$

$$Z_{22} = \frac{r_{o,m} R_{opt,m} \beta_{bk}(r_c + e^{j2\theta})}{r_c^2 (1 - \beta_{bk})},$$

where $R_{opt}$ is the optimum class B load, and where $Z_{21} = Z_{12}$.

According to some aspects, $r_c$, $r_{o,a}$ and $r_{o,m}$ are selected so that $S_{aux} = 1$ for a selected back-off power level $\gamma$, for $r_{o,m} > 1$, $r_{o,a} \geq 1$.

According to some aspects, $r_c$, $r_{o,a}$ and $r_{o,m}$ are selected so that $S_{aux} = 1$ for a selected back-off power level $\gamma$, for $r_{o,m} \geq 1$, $r_{o,a} > 1$.

There is also provided a computer program comprising computer program code which, when executed in a computer, causes the computer to execute a method according to any of the above discussed aspects.

There is also provided a computer program product comprising the above computer program and a computer readable means on which the computer program is stored.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

The invention is now described, by way of example, with reference to the accompanying drawings, in which.

DETAILED DESCRIPTION

The present technique will now be described more fully hereinafter with reference to the accompanying drawings, in which certain embodiments of the present technique are shown. The present technique may, however, be embodied in many different forms and should not be construed as limited to the embodiments set forth herein; rather, these embodiments are provided by way of example so that this disclosure will be thorough and complete, and will fully convey the scope of the technique to those skilled in the art. Like numbers refer to like elements throughout the description.

Figure 1A:
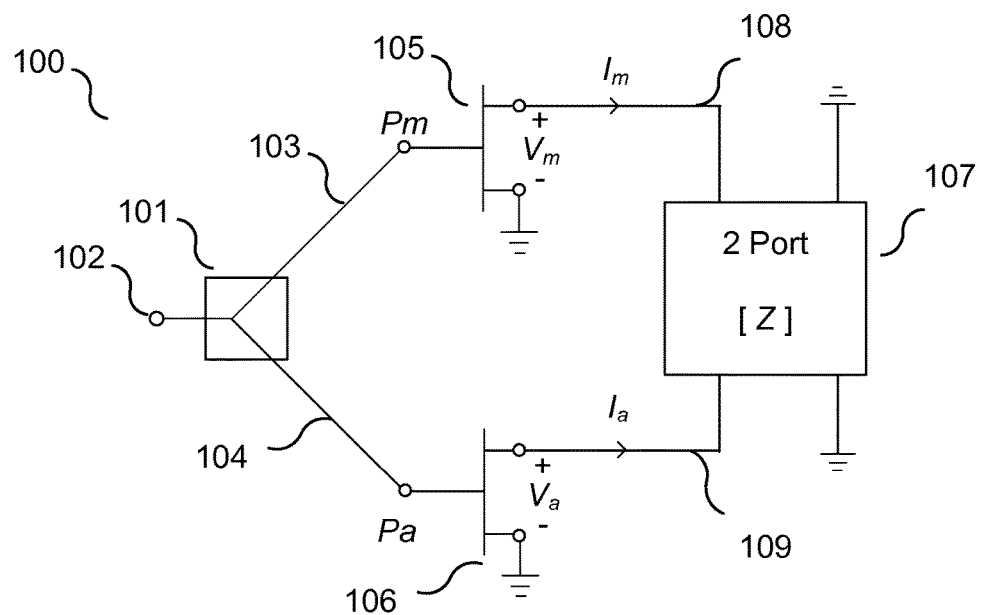
FIGS. 1a-b are schematic illustrations of an amplifier arrangement.

FIG. 1a is a schematic illustration of an amplifier arrangement 100 comprising an input power splitter 101 configured to divide an input signal 102 into a first signal 103 having a power $P_m$ and a second signal 104 having a power $P_a$, a main transistor 105 connected to the power splitter and arranged to receive the first signal 103, the main transistor being configured to operate in a class -B like mode of operation to provide a first output signal 108, an auxiliary transistor 106 connected to the power splitter and arranged to receive the second signal 104, the auxiliary transistor being configured to operate in a class-C mode of operation to provide a second output signal 109. The amplifier arrangement further comprises a combining network, here represented by a two port network 107. In the present context, a class-B like mode of operation includes both class-B and almost class-B modes of operation. It is appreciated that the majority of advantages and effects described herein are equally applicable for modes of operation which resembles or are close to class-B mode operation. Although the power splitter 101 is mainly discussed with reference to an analog power splitter, a digital power splitter may equally well be used.

Figure 1B:
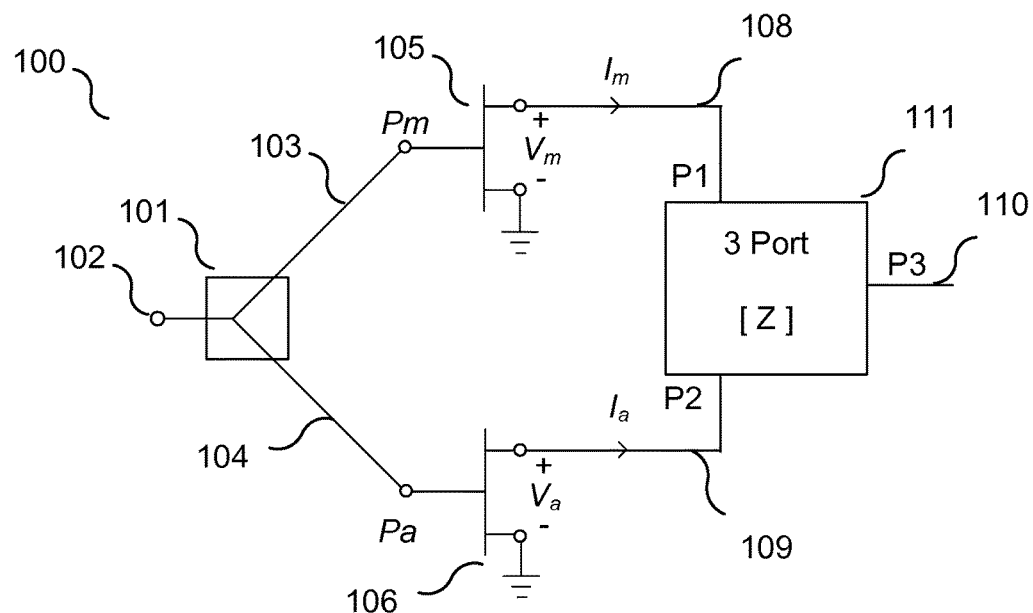

FIG. 1b schematically illustrates an amplifier arrangement as in Fig. 1a, but where the combining network is represented by a three port network 111 configured to couple the first and second output signals 108, 109 of the main and auxiliary transistors 105, 106 to an output node (110) of the amplifier arrangement. The three port network comprises a first port P1 connected to the output of the main transistor 105, a second port P2 connected to the output of the auxiliary transistor 106, and a third port P3 connected to the output node 110.

The input signals 103,104 are derived from an RF source (not shown) using an analog splitter 101. The outputs 108, 109 of the main and the auxiliary transistors 105, 106 are combined with a reciprocal two port network 107. The load resistance is thus included in the two-port network. At this point, the transistor currents are arbitrary.

The combiner load network is synthesized using a black-box approach where the network parameters are derived from the desired operating conditions. These conditions are:
1. At maximum input voltage drive level
  The optimal load is presented to the main transistor
  The optimal load is presented to the auxiliary transistor
2. At some desired input voltage drive level back-off
  The optimal load is presented to the main transistor
  The auxiliary transistor turns off
3. Lossless combiner network (excluding the resistive load)
  Here, optimal load means that the available transistor voltage swing is fully utilized. The above conditions will be referred to as Doherty conditions henceforth.

In order for the two port representation to be of any use, it must be possible to convert the two port network into a lossless and reciprocal three port network with the load resistance terminated at the third port. This gives the following requirement of the two port network parameters:

$$\text{Real}(Z_{12})^2 = \text{Real}(Z_{11}) \cdot \text{Real}(Z_{22}). \quad (1)$$

Finally, it is important to mention that, it is always possible to realize a lumped element combiner network using known synthesis methods. The resulting network can then be transformed to a transmission line network if desired.

The current source in each transistor is modelled with $$i_{DS} = \begin{cases} 0, & v_{GS} < V_T \\ g_m(v_{GS} - V_T), & V_T \leq v_{GS} \leq V_{SAT} \\ I_{MAX}, & V_{SAT} < v_{GS} \end{cases} \quad (2)$$

where $V_T$ is the threshold voltage, $V_{SAT}$ is the saturation voltage, and $$I_{MAX} = g_m(V_{SAT} - V_T). \quad (3)$$

The gate of each transistor is driven by a voltage $$v_{GS} = V_{GS,DC} + v_{gs} = V_{GS,DC} + \beta V_{gs,max} \sin(\omega_o t), \quad (4)$$

where $\beta$ is the normalized input voltage drive level, $0 \leq \beta \leq 1$, and $$V_{gs,max} = V_{SAT} - V_{GS,DC}. \quad (5)$$

It is assumed that the main transistor is biased for class-B operation and the auxiliary transistor is biased for class-C operation. The current flowing through the class-B biased main transistor is $$i_M(\beta_m) = \begin{cases} \beta_m I_{MAX,m} \sin(\omega_o t), & 0 \leq \omega_o t \leq \pi \\ 0, & \text{otherwise} \end{cases}, \quad (6)$$

where $\beta_m$ is the normalized main input voltage drive level, $0 \leq \beta_m \leq 1$, and $I_{MAX,m}$ is the maximum DC current for the main transistor. The current flowing through the class-C biased auxiliary transistor is $$i_A(\beta_a) = \begin{cases} \dfrac{S_{aux} I_{MAX,m}}{1 - \beta_{a,bk}} (\beta_a \sin(\omega_o t - \theta) - \beta_{a,bk}), & \phi_x \leq \omega_o t - \theta \leq \pi - \phi_x \\ 0, & \text{otherwise} \end{cases}, \quad (7)$$

where $\beta_a$ and $\beta_{a,bk}$ are the auxiliary input voltage drive level, $0 \leq \beta_a \leq 1$ and $0 \leq \beta_{a,bk} \leq 1$, and the auxiliary input voltage drive level back-off, respectively. The parameter $\beta_{a,bk}$ is the drive level where the auxiliary transistor is turned off, i.e. does not conduct any current. Here, $S_{aux}$ is the total auxiliary transistor size scale compared to the main transistor, and $\theta$ is the phase delay between the main and auxiliary transistor currents. The turn on angle is given by $$\phi_x = \sin^{-1}\left(\frac{\beta_{a,bk}}{\beta_a}\right). \tag{8}$$

Since it is the relation between the main and auxiliary transistor's currents that determines the DPA behaviour, either the main or the auxiliary transistor can be underutilized in order to change the physical size ratio between the two transistors without affecting the current relation. Therefore, two underutilizing parameters are introduced according to $$\beta_m = U_{V,m}\beta, \tag{9}$$

$$\beta_a = U_{V,a}\beta, \tag{10}$$

$$\beta_{a,bk} = U_{V,a}\beta_{bk}, \tag{11}$$

where $U_{V,m}$ and $U_{V,a}$ are the transistor input voltage utilization for the main transistor and auxiliary transistor, respectively. Input voltage utilization means the maximum operational input voltage swing over the maximum possible input voltage swing, thus $0 \leq U_{V,m} \leq 1$ and $0 \leq U_{V,a} \leq 1$. The main and auxiliary transistors are now related to a common input voltage drive level $\beta$ and a common input voltage drive back-off $\beta_{bk}$, where $0 \leq \beta \leq 1$. Observe that auxiliary transistor is turned off when $\beta \leq \beta_{bk}$. The term $\beta_{bk}$ will later be solved in terms of $\gamma$.

In order to calculate network parameters of the combiner and overall PA performance, currents at the DC and fundamental tone have to be known. Fourier series expansion of equation (6) and (7) yield $$I_{M,DC} = U_{V,m}\beta \frac{I_{MAX,m}}{\pi}, \tag{12}$$

$$I_m = -jU_{V,m}\beta \frac{I_{MAX,m}}{2}, \tag{13}$$

$$I_{A,DC} = \begin{cases} -\frac{S_{aux}I_{MAX,m}U_{V,a}}{\pi} \frac{\beta\sqrt{1-\left(\frac{\beta_{bk}}{\beta}\right)^2} - \beta_{bk}\cos^{-1}\left(\frac{\beta_{bk}}{\beta}\right)}{U_{V,a}\beta_{bk} - 1}, & \beta \geq \beta_{bk} \\ 0, & \beta < \beta_{bk} \end{cases} \tag{14}$$

$$I_a = \begin{cases} -j\frac{S_{aux}I_{MAX,m}U_{V,a}}{\pi} \frac{\beta_{bk}\sqrt{1-\left(\frac{\beta_{bk}}{\beta}\right)^2} - \beta\cos^{-1}\left(\frac{\beta_{bk}}{\beta}\right)}{U_{V,a}\beta_{bk} - 1} e^{-j\theta}, & \beta \geq \beta_{bk} \\ 0, & \beta < \beta_{bk} \end{cases} \tag{15}$$

The auxiliary transistor size ratio can be scaled in three ways: oversizing the main transistor, i.e. underutilizing the main transistor; oversizing the auxiliary transistor, i.e. underutilizing the auxiliary transistor; and current scaling, which is a method resulting in non-classical current profiles and different DPA behavior. The present technique relates to a new description of the DPA operation as a function of the three different ways of scaling the auxiliary transistor in a continuous way. This continuous approach yields amplifier solutions with significantly higher gain or smaller size compared to the classical Doherty amplifier.

The total auxiliary transistor size compared to the main transistor is defined as $$S_{aux} = \frac{r_{o,a}}{r_{o,m}} S_c, \tag{16}$$

where $r_{o,m}$ is the oversizing ratio of the main transistor and $r_{o,a}$ is the oversizing ratio of the auxiliary transistor. The parameter $S_c$ is a size ratio between the two transistors, dependent on an auxiliary current scaling factor $r_c$ and the input voltage drive level back-off $\beta_{bk}$. With full utilization of the transistors, i.e. when $U_{V,a}=U_{V,m}=1$, the oversizing ratios are $r_{o,a}=r_{o,m}=1$. The exact relationships between the oversizing ratios and utilization factors will be derived later. So far, $r_c$ could take any value. When $r_c=r_{o,a}=r_{o,m}=1$, equation (16) becomes the size ratio between the two transistors for a classical DPA.

Figure 2A:
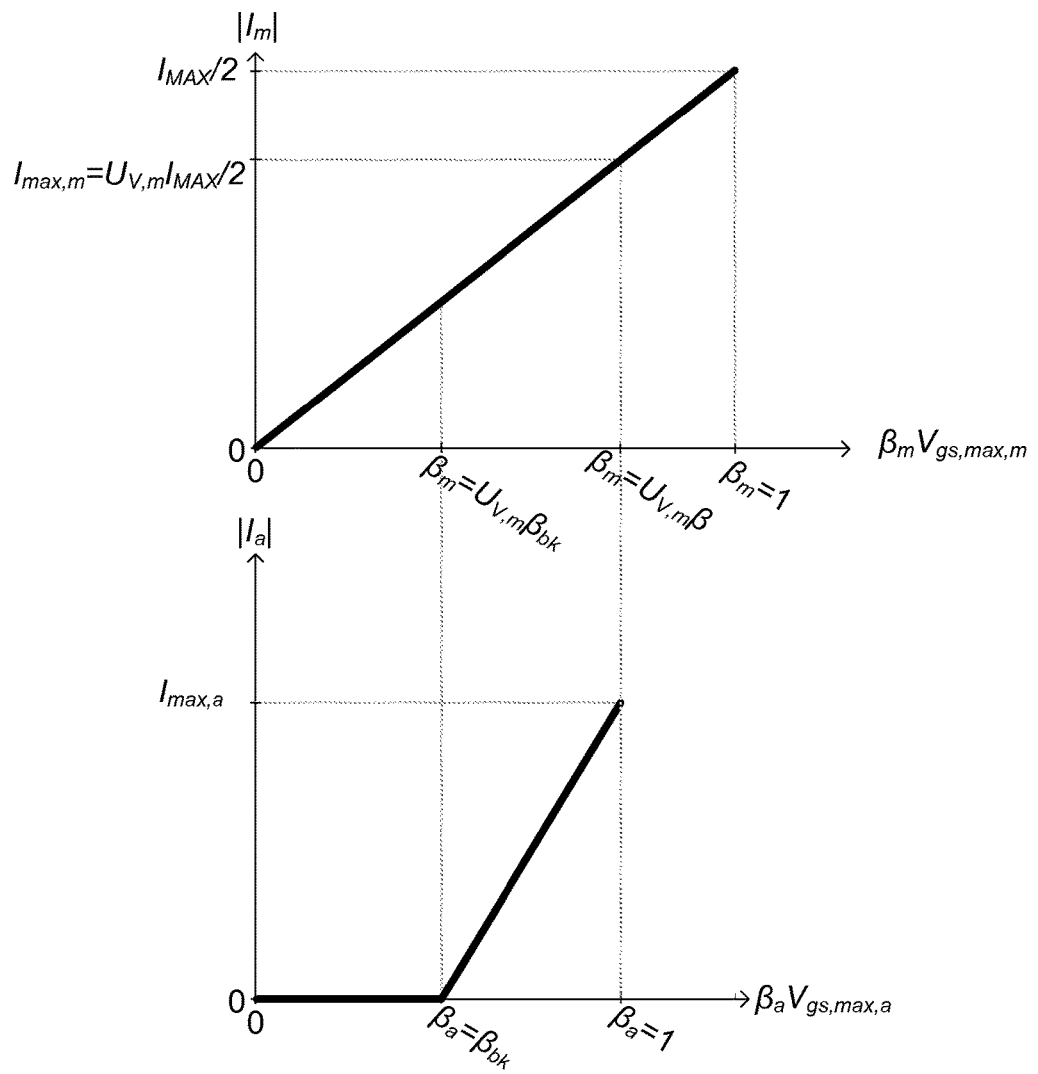
FIGS. 2a-c schematically illustrate current profiles for amplifiers according to embodiments of the present technique.
Figure 2B:
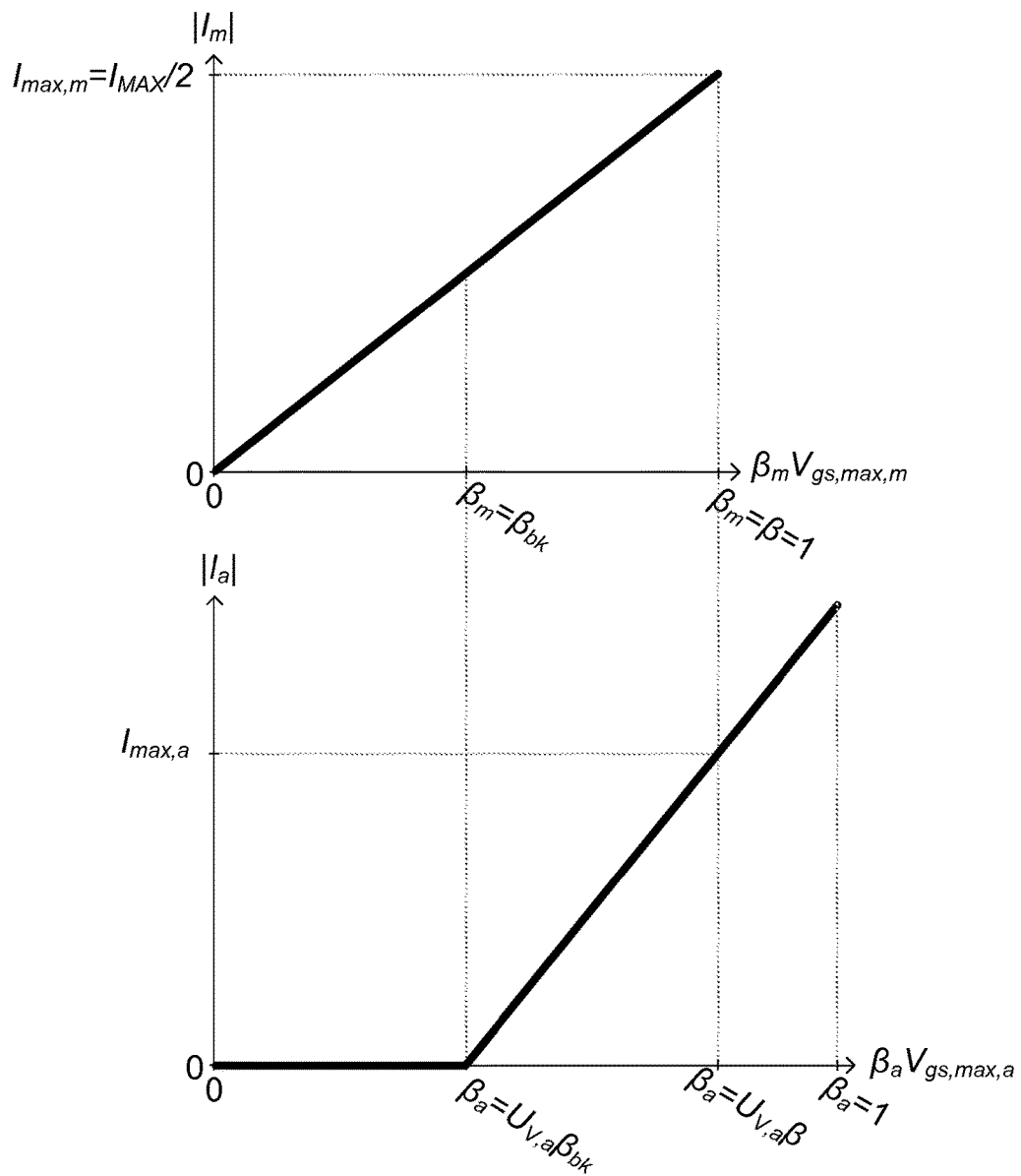
Figure 2C:
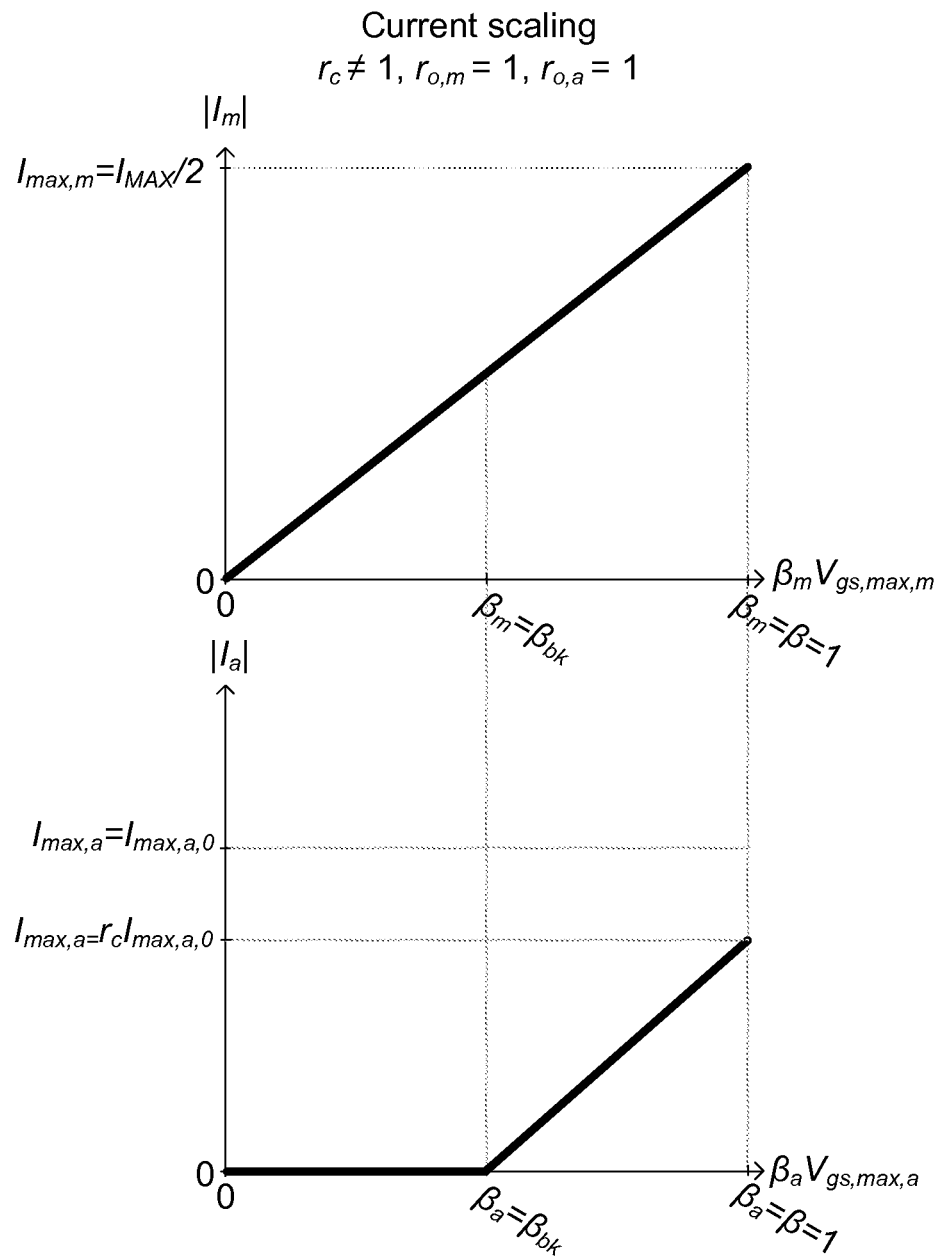

The difference between oversizing and current scaling is demonstrated in FIGS. 2a-c where the class-C auxiliary current has been approximated as a linear function to simplify the discussion. In FIGS. 2-c, it can be seen how oversizing relates to underutilization, and how current scaling results in a different current profile compared to the classical DPA current profile. In articular, FIG. 2a illustrates oversizing the main transistor, FIG. 2b illustrates oversizing the auxiliary transistor and FIG. 2c illustrates current scaling of the auxiliary transistor.

Moreover in FIGS. 2a-c, the maximum fundamental drain currents are denoted by $I_{max,m}$ and $I_{max,a}$, respectively. The maximum fundamental drain current of the auxiliary transistor without current scaling is denoted by $I_{max,a,0}$. The maximum magnitude of the classical DPA auxiliary current, i.e. without any oversizing (underutilization) or current scaling, can be expressed as $$I_{max,a,0} = \frac{I_{MAX,m}}{2}\left(\frac{1}{\beta_{bk}} - 1\right). \tag{17}$$

If the auxiliary transistor current is scaled, equation (17) will be scaled according to $$I_{max,a} = r_c I_{max,a,0}. \tag{18}$$

The magnitude of equation (15), with equation (16) inserted and with no underutilization, i.e. $r_{o,m}=r_{o,a}=1$, must be equal to equation (18). This gives $$S_c = r_c \frac{\pi}{2} \frac{(\beta_{bk} - 1)^2}{\beta_{bk}\left(\cos^{-1}(\beta_{bk}) - \beta_{bk}\sqrt{1-\beta_{bk}^2}\right)}, \tag{19}$$

If the main transistor is underutilized, the maximum current from the auxiliary transistor will be scaled according to $$I_{max,a} = U_{V,m} r_c I_{max,a,0}. \tag{20}$$

The magnitude of equation (15), with equation (16) inserted and with $r_{o,a}=1$, must be equal to equation (20). This gives $$U_{V,m} = \frac{1}{r_{o,m}}. \tag{21}$$

The magnitude of equation (15), with equation (16) and (21) inserted, must be equal to equation (20). This gives $$U_{V,a} = \frac{1}{\beta_{bk}(1-r_{o,a})+r_{o,a}}. \quad (22)$$

From the given limits of the input voltage utilization parameters, the oversizing factors $r_{o,a}$ and $r_{o,m}$ must be larger or equal to one.

The parameter $\beta_{bk}$ may be solved in terms of $\gamma$ from the fact that only main transistor is active at $\gamma$ dB back-off from the peak output power level $$P_{out,m|\beta=1} + P_{out,a|\beta=1} = \gamma P_{out,m|\beta=\beta_{bk}}, \quad (23)$$

where $$P_{out,m}=0.5V_{DS}|I_m|, \quad (24)$$

$$P_{out,a}=0.5V_{DS}|I_a|. \quad (25)$$

where $V_{DS}$ is the magnitude of the maximum drain voltage swing of the transistors. From equation (23), $\gamma$ can be expressed as $$\gamma = \frac{\beta_{bk}(1-r_c)+r_c}{\beta_{bk}^2}, \quad (26)$$

and $\beta_{bk}$ can be expressed as $$\beta_{bk} = \frac{\sqrt{4r_c\gamma+(r_c-1)^2}-(r_c-1)}{2\gamma}, \quad (27)$$

It is easy to see that the classical DPA relation is found when $r_c=1$, i.e.

$$\gamma|_{r_c=1} = \frac{1}{\beta_{bk}^2}. \quad (28)$$

Thus, the transistor size ratio without underutilization and current scaling, i.e. the size ratio for a classical DPA becomes $$S_{aux}|_{r_c=r_{o,m}=r_{o,a}=1} = \frac{\pi}{2}\frac{\sqrt{\gamma}(\sqrt{\gamma}-1)^2}{\gamma\sec^{-1}(\sqrt{\gamma})-\sqrt{\gamma-1}}, \quad (29)$$

where sec is the secant. This concludes the general description of the DPA currents and related design parameters.

Figure 3:
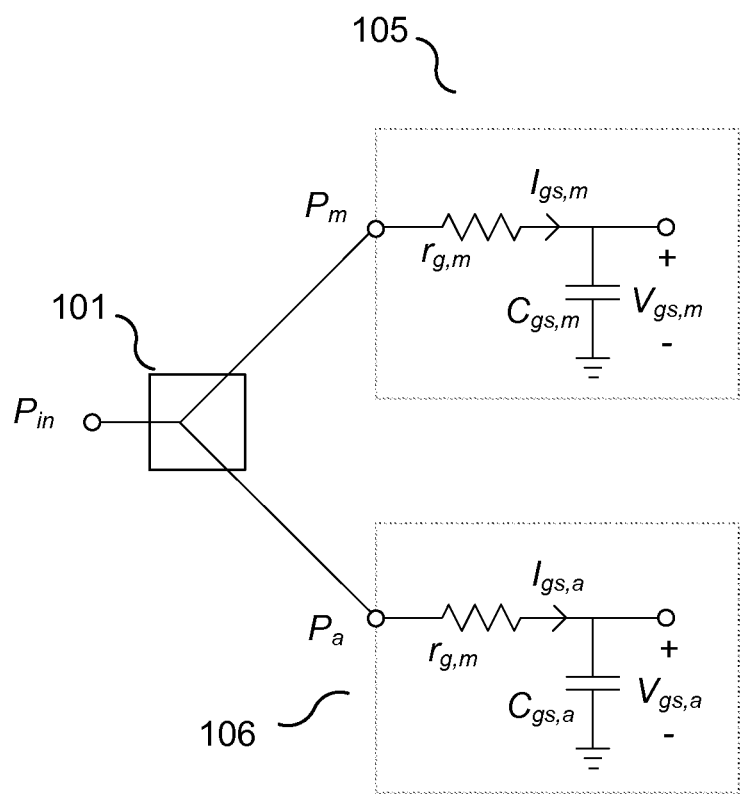
FIG. 3 is a schematic illustration of an amplifier input model.

In order to calculate the gain loss resulting from the input power splitter, scaling of the transistor parasitics need to be taken into account. A DPA input mode illustrating the main and auxiliary transistor 105, 106 parasitics can be seen in FIG. 3. In this model, the splitter 101 is conjugate matched to the transistors.

The input power splitter divides the input power according to $$P_m = d_{P,m}P_{in}, \quad (30)$$

$$P_a = (1-d_{P,m})P_{in}, \quad (31)$$

where $d_{P,m}$ is the main transistor power dividing factor and is equal to small signal gain loss since when the auxiliary transistor is turned off, the power injected into the auxiliary transistor is just wasted, and Pin is the input power.

The parasitics scale according to $$r_{g,a} = \frac{r_{g,m}}{S_{aux}}, \quad (32)$$

$$C_{gs,a}=C_{gs,m}S_{aux}. \quad (33)$$

The main and auxiliary input power can be written as $$P_m=|I_{gs,m}|^2 r_{g,m}=|V_{gs,m}|^2(\omega_0 C_{gs,m})^2 r_{g,m}, \quad (34)$$

$$P_a=|I_{gs,a}|^2 r_{g,a}=|V_{gs,a}|^2(\omega_0 C_{gs,a})^2 r_{g,a}. \quad (35)$$

When combining equation (30) to (35), the input voltage ratio, $V_R$, can be expressed as $$V_R^2 = \frac{|V_{gs,a}|^2}{|V_{gs,m}|^2} = \frac{d_{P,m}-1}{d_{P,m}S_{aux}}, \quad (36)$$

which gives $$d_{P,m} = \frac{1}{V_R^2 S_{aux}+1}. \quad (37)$$

The input voltage ratio can also be expressed as $$V_R = \frac{V_{gs,max,a}U_{V,a}}{V_{gs,max,m}U_{V,m}} = \frac{(V_{SAT}-V_{GS,a})U_{V,a}}{(V_{SAT}-V_{GS,m})U_{V,m}}. \quad (38)$$

The main transistor is class-B biased, meaning $V_{GS,m}=V_T$. The auxiliary transistor turns off when $$V_{GS,a}+\beta_{bk}V_{gs,max,a}U_{V,a}32\ V_T, \quad (39)$$

which gives $$V_{GS,a} = \frac{V_T-\beta_{bk}V_{SAT}U_{V,a}}{1-\beta_{bk}U_{V,a}}. \quad (40)$$

When inserted in equation (38) and combined with equation (22) the following expression is obtained $$V_R = \frac{r_{o,m}}{r_{o,a}(1-\beta_{bk})}, \quad (41)$$

which finally yields the main split ratio as a function of $r_{o,m}$, $r_{o,a}$ and $S_c$ $$d_{P,m} = \frac{1}{1 + \frac{r_{o,m}}{r_{o,a}} \frac{S_c}{(\beta_{bk}-1)^2}}. \quad (42)$$

It should be remembered that $S_c$ is a function of $r_c$ and $\beta_{bk}$, which is defined in equation (19). To minimize the DPA small signal gain loss from the input power splitter for a given $\beta_{bk}$, i.e. maximizing $d_{P,m}$; the current scaling ratio, $r_c$, should be as low as possible; the main oversizing ratio, $r_{o,m}$, should be as small as possible; and the auxiliary oversizing ratio, $r_{o,a}$, should be as large as possible. Due to practical reasons, oversizing the transistors too much is often not a good choice.

The Doherty conditions outlined above can be expressed in equations, as:

1. At maximum input voltage drive level ($\beta=1$)
The optimal load is presented to the main transistor $$\frac{V_{m|\beta=1}}{I_{m|\beta=1}} = \frac{V_{DS}}{|I_{m|\beta=1}|} = r_{o,m} R_{opt,m} \quad (43)$$

The optimal load is presented to the auxiliary transistor $$\frac{V_{a|\beta=1}}{I_{a|\beta=1}} = \frac{V_{DS}}{|I_{a|\beta=1}|}. \quad (44)$$

2. At some desired input voltage drive level back-off ($\beta=\beta_{bk}$).
The optimal load is presented to the main transistor $$\frac{V_{m|\beta=\beta_{bk}}}{I_{m|\beta=\beta_{bk}}} = \frac{V_{DS}}{|I_{m|\beta=\beta_{bk}}|} \quad (45)$$

The auxiliary transistor turns off $$I_{a|\beta=\beta_{bk}} = 0. \quad (46)$$

3. Lossless combiner network (excluding the resistive load)

$$\text{Real}(Z_{12})^2 = \text{Real}(Z_{11}) \cdot \text{Real}(Z_{22}), \quad (47)$$

where $V_{DS}$ is the magnitude of the maximum drain voltage swing of the transistors and $R_{opt,m}$ is the conventional optimum class-B load resistance, which is the maximum voltage swing over the maximum current swing at the drain of the transistor during full utilization for class-B operation.

Now, the two port network parameters can be solved from equation (43) to (47), expressed in terms of the design parameters. The definition of the two port Z-matrix gives $$\frac{V_m}{I_m} = Z_{11} + Z_{12} \frac{I_a}{I_m}, \quad (48)$$

$$\frac{V_a}{I_a} = Z_{22} + Z_{12} \frac{I_m}{I_a}. \quad (49)$$

Combining equation (43) to (47) with equation (48) and (49) yields $$Z_{11} = \frac{r_{o,m} R_{opt,m}}{\beta_{bk}}, \quad (50)$$

$$Z_{12} = -\frac{r_{o,m} R_{opt,m} e^{j\theta}}{r_c}, \quad (51)$$

$$Z_{22} = \frac{r_{o,m} R_{opt,m} \beta_{bk} (r_c + e^{j2\theta})}{r_c^2 (1 - \beta_{bk})}. \quad (52)$$

Note that the two port Z-parameters are independent of $r_{o,a}$ as expected. The static phase delay $\theta$ is given by the third item in the Doherty conditions (equation (47)), and has four solutions according to $$\theta = \begin{cases} \pm \theta_x \\ \pm (\pi - \theta_x) \end{cases}, \quad (53)$$

where $$\theta_x = \tan^{-1}\left(\sqrt{\frac{\beta_{bk} + r_c}{1 - r_c}}\right). \quad (54)$$

The above expressions show that the two port network parameters are derived only in terms of transistor technology parameters and the design variables $r_c$, $r_{o,m}$ and $\beta_{bk}$, where the latter is a function of $\gamma$ (back-off efficiency peak level) and $r_c$. It is easy to see that if $r_c=1$, the classical DPA network parameters fall out of the equations. It can also be seen that $r_c \leq 1$ for physical solutions. A lower limit of $r_c$ will be set by the condition that the drain voltage must always be larger than zero, which yields $$\frac{2}{\gamma + 1} \leq r_c \leq 1. \quad (55)$$

In the following, the theoretical performance of the proposed technique is evaluated in terms of drain efficiency versus back-off and gain for different values of $r_c$ for a fixed $\gamma$.

In the following discussion, the performance of the general Doherty concept is evaluated with ideal transistors. To simplify, the class-C biased auxiliary transistor drain DC and fundamental currents have been approximated as linear functions of $\beta$ according to $$I_{A,DC,lin} = \begin{cases} 0, & \beta < \beta_{bk} \\ |I_{A,DC|\beta=1}| \frac{\beta - \beta_{bk}}{1 - \beta_{bk}}, & \beta_{bk} \leq \beta \end{cases} \quad (56)$$

$$I_{a,lin} = \begin{cases} 0, & \beta < \beta_{bk} \\ -j|I_{a|\beta=1}| \frac{\beta - \beta_{bk}}{1 - \beta_{bk}} e^{-j\theta}, & \beta_{bk} \leq \beta \end{cases} \quad (57)$$

The actual ideal class-C has a soft turn on effect, which only slightly will affect the DPA behavior: it will make the main drain voltage negative for some values of $\beta$, which is non-physical. This, however, is solved by shifting biases slightly. This shift will degrade the efficiency slightly. A linear approximation of the class-C biased auxiliary transistor drain DC and fundamental currents is much more pedagogical when studying the DPA behavior and it barley changes the DPA performance.

The following solutions are compared for γ=6 dB.
Classical Doherty–$S_{aux}$=1.27
Symmetrical Doherty[8]–$S_{aux}$=1.00
Smallest possible size Doherty–$S_{aux}$=0.71

In all of these three Doherty solutions, the main and auxiliary transistor are fully utilized, i.e. $r_{o,m}=r_{o,a}=1$. The solutions differ by different current scaling, i.e. $r_c \leq 1$. A smaller auxiliary transistor size than $S_{aux}$=0.71 is not possible since the drain voltage will become negative.

FIGS. 4a-f are graphs outlining the performance for the three solutions above, where the curves representing $S_{aux}$=1.27 are denoted 401, $S_{aux}$=1.00 are denoted 402, and $S_{aux}$=0.71 are denoted 403. When the auxiliary transistor current is scaled, the auxiliary transistor current profile will differ from the classical DPA current profile, which clearly can be seen in FIGS. 4a-4b. The voltage profiles for the scaled solutions will also differ from the classical DPA voltage profiles, see FIG. 4c-d. The classical DPA auxiliary transistor operates in deeper class-C than the down-scaled versions. The deeper the class-C bias, the higher the efficiency. At higher power levels, the total DPA efficiency is a combination of the efficiency of the class-C biased auxiliary transistor and the efficiency of the class-B biased main transistor. Thus, the classical DPA has slightly higher efficiency at higher power levels, see FIG. 4e.

Figure 4A:
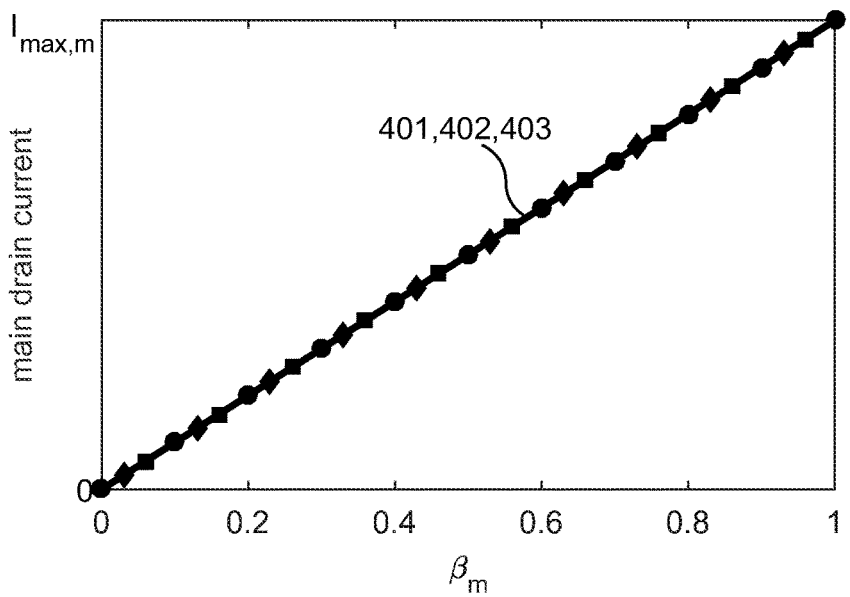
FIGS. 4a-f are graphs schematically illustrating the performance of exemplary amplifier arrangements.
Figure 4B:
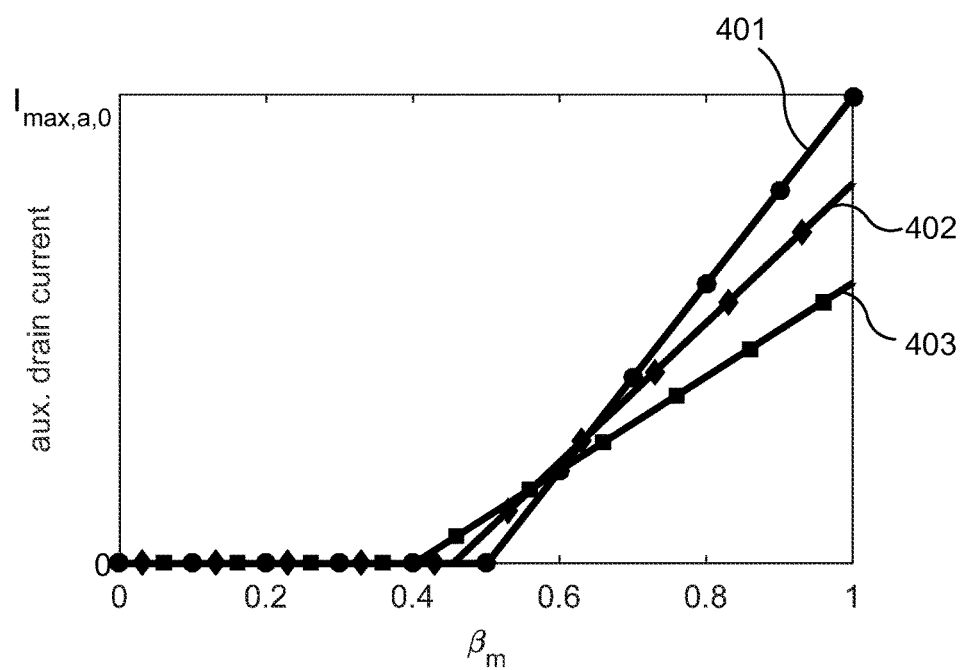
Figure 4C:
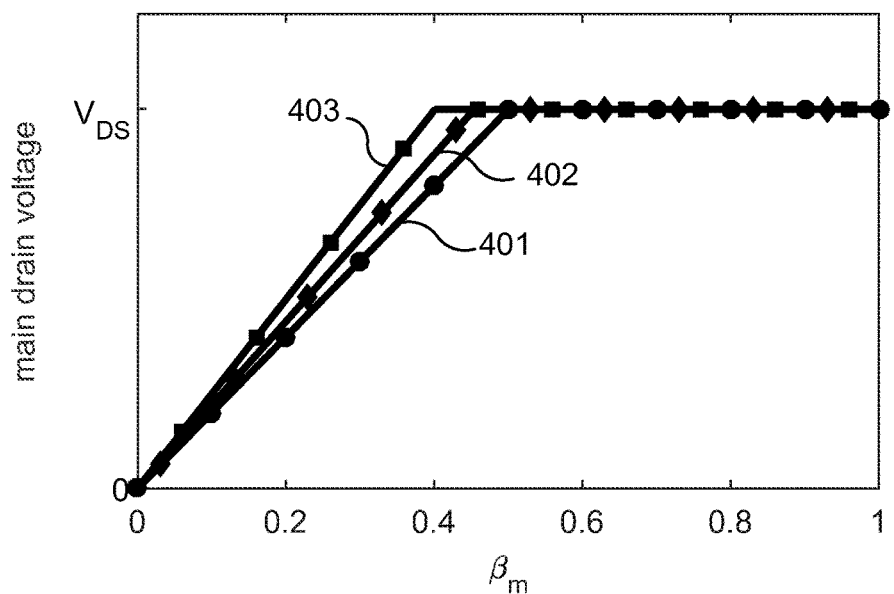
Figure 4D:
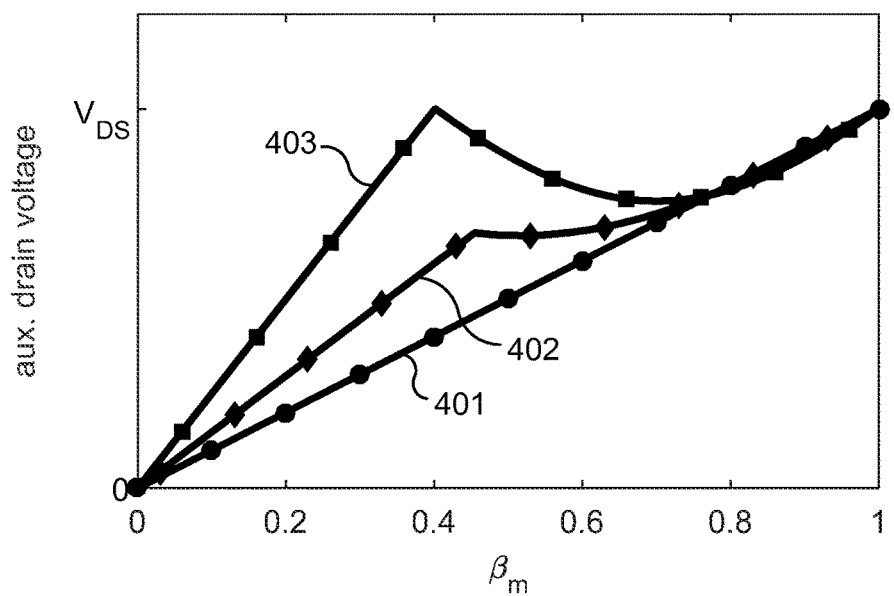
Figure 4E:
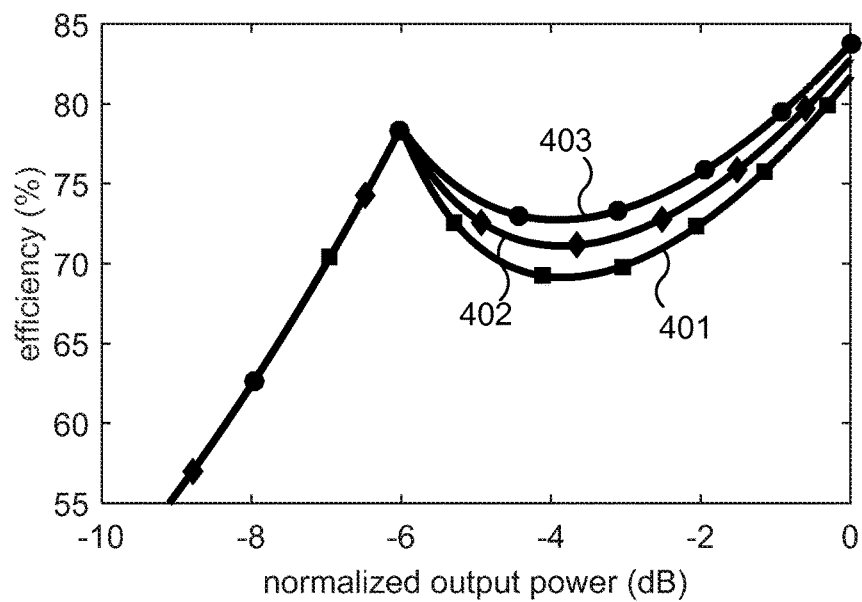
Figure 4F:
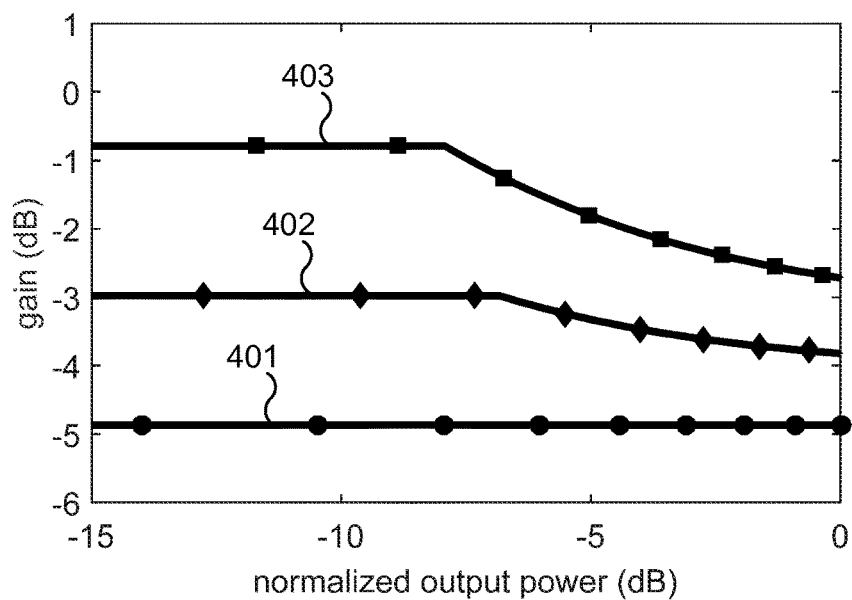

The gain of the three cases plotted in FIG. 4f is normalized against the conventional class-B PA gain. The gain of the downscaled DPA solutions is considerably higher than the classical DPA solution. In FIG. 4f, it can be seen that the downscaled sizes present a slightly increased non-linearity at high powers. In practice, output power saturation is a typical behavior for any kind of power amplifier. It is therefore not obvious if the inherent gain expansion behavior of the proposed concept is an important limitation for the linearity.

Figure 5A:
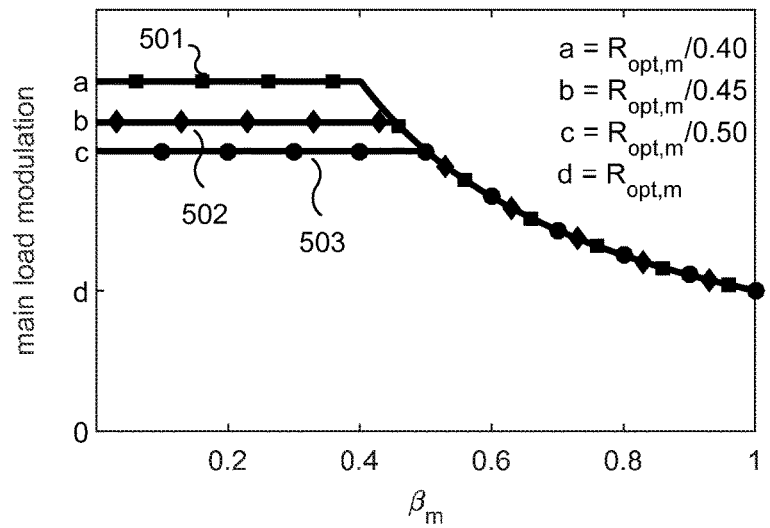
FIGS. 5a-c schematically illustrate the main and auxiliary transistor load modulations for an exemplary amplifier arrangement.
Figure 5B:
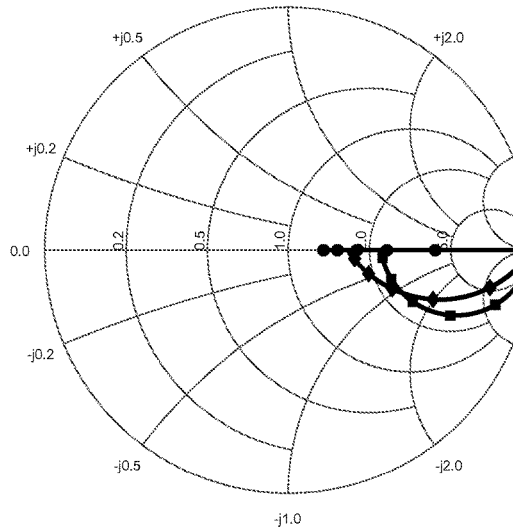
Figure 5C:
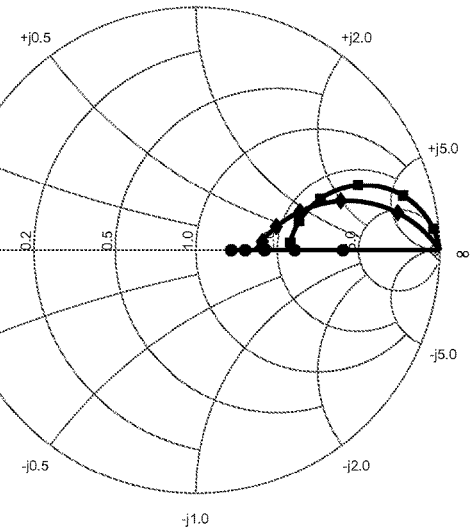

The main and auxiliary transistor load modulations are plotted in FIGS. 5a-c for $R_{opt,m}/0.40$, 501, for $R_{opt,m}0.45$, 502, and $R_{opt,m}/0.50$, 503. The main transistor load modulation is always purely resistive and goes from $R_{opt,m}$ at maximum power to $R_{opt,m}/\beta_{bk}$ at back-off. The auxiliary load modulation is purely resistive for the classical DPA solution but becomes complex for the down-scaled solutions, as shown in FIG. 5b and FIG. 5c. It goes from $V_{a|\beta=1}/I_{a|\beta=1}$ at maximum power to infinity at back-off. Note the different paths for the different possible choices of θ.

Another solution to the general Doherty concept is to use the current profiles and network parameters of the smallest possible size DPA solution, and utilize the well-known concept of oversizing the auxiliary transistor. This will further increase the gain without changing the DPA behavior. Oversizing should be modest though, since a too large auxiliary transistor will present practical problems. A good compromise is to oversize the smallest possible size DPA solution up to symmetrical transistor sizes, since the use of symmetrical sizes ha a lot of practical benefits. This particular solution to the general Doherty concept is from here on referred to as "Symmetrical low auxiliary current Doherty" where $S_{aux}$=1.0.

Figure 6:
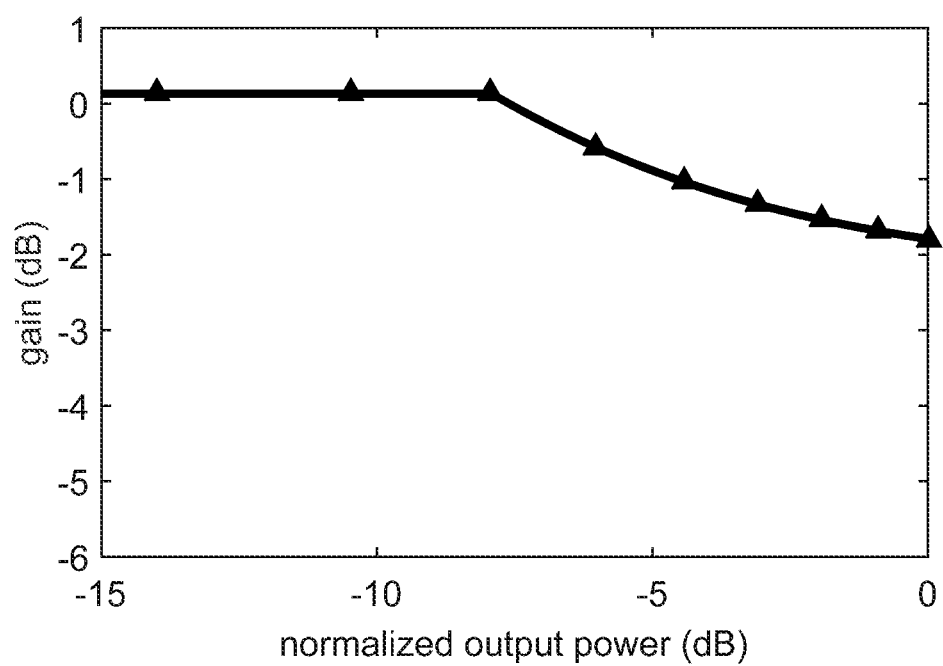
FIG. 6 is a graph schematically illustrating the gain for an exemplary amplifier arrangement.

Note that this particular Doherty solution has the same current scaling, $r_c$, as the "Smallest possible size Doherty", but with an oversizing $r_{o,a}$>1. The gain of the symmetrical low auxiliary current DPA for γ=6 is plotted in FIG. 6. Note that this gain is a translation upwards compared to the gain of the smallest possible size DPA.

The performance for γ=6 of the classical DPA, the symmetrical DPA, the smallest possible size DPA and the symmetrical low auxiliary current DPA is summarized in Table 1 below. The small signal gain is normalized with the gain of the conventional class-B PA. The maximum output power is normalized to maximum output power of the classical DPA.

TABLE 1

| | | Classical | Symm. | Smallest possible size | Symmetrical low aux. current |
|---|---|---|---|---|---|
| Aux. size compared to main size | $S_{aux}$ | 1.27 | 1 | 0.71 | 1 |
| Input voltage drive level back-off | $\beta_{bk}$ | 0.50 | 0.45 | 0.40 | 0.40 |
| Current scaling ratio | $r_c$ | 1 | 0.68 | 0.40 | 0.40 |
| Main oversizing ratio | $r_{o,m}$ | 1 | 1 | 1 | 1 |
| Aux. oversizing ratio | $r_{o,a}$ | 1 | 1 | 1 | 1.41 |
| Output current phase difference | $\theta_x$ | 90° | 61.8° | 49.2° | 49.2° |
| Small signal gain comp. to class-B | $G_{small}$ | −4.87 dB | −2.97 dB | −0.79 dB | +0.14 dB |
| Maximum output power | $P_{max}$ | 0 dB | −0.42 dB | −0.96 dB | −0.96 dB |
| Power utilization factor | PUF | 0.110 | 0.113 | 0.117 | 0.100 |

Trough the above discussion, it has been shown that the general Doherty concept yields many interesting solutions: two of them being the smallest possible size DPA and the symmetrical low auxiliary current DPA. The smallest possible size DPA yields the highest possible power utilization factor (PUF) which directly can be translated into small chip size, and therefore cost in MMIC realizations. The symmetrical low auxiliary current DPA yields the highest possible gain (for solutions with reasonable auxiliary sizes), which is a key parameter millimeter wave frequency designs. Both of these solutions to the general Doherty concept results in significantly higher gain compared to previously studied topologies. Better performance and higher flexibility offered by the new concept therefore makes it a very strong candidate for base station-, microwave link-, and handset applications.

It should be emphasized that the general Doherty concept offers a continuous set of solutions and any compromise between the system performances can be selected and realized. It should also be remembered that the general Doherty concept is valid for any back-off efficiency peak level.

In the following, a design example is given to demonstrate how the above discussed improvements relate to the performance with realistic devices and communication signals.

In following example, the general Doherty concept is evaluated by simulations at 23 GHz for a 6 dB PAPR (Peak to average power ratio) WCDMA (Wideband Code Division Multiple Access) signal. An ideal voltage controlled current source is used as transistor model in the simulations (see equation (2)). The design is made for a back-off efficiency peak at γ=6 dB. The transistor model parameters are based on the TriQuint 0.15 μm 8×100 μm GaN HEMT. This transistor provides a maximum current of $I_{MAX}$=0.6 A and is biased at 20 V. The linear small signal class-B gain of this transistor is 9 dB at 23 GHz.

The calculated Z-parameters for the two port network for the classical DPA, symmetrical DPA and smallest size DPA/symmetrical small current DPA are presented in Table 2 below, and where $Z_{21}$=$Z_{12}$.

TABLE 2

|  | Classical | Symmetrical | Small size/ Symmetrical small current |
| --- | --- | --- | --- |
| $Z_{11}$ | 133 Ω | 146 Ω | 166 Ω |
| $Z_{12}$ | 0 − j66 Ω | −47 − j87 Ω | −109 − j126 Ω |
| $Z_{22}$ | 0 + j0 Ω | 15 + j102 Ω | 71 + j275 Ω |

Figure 7:
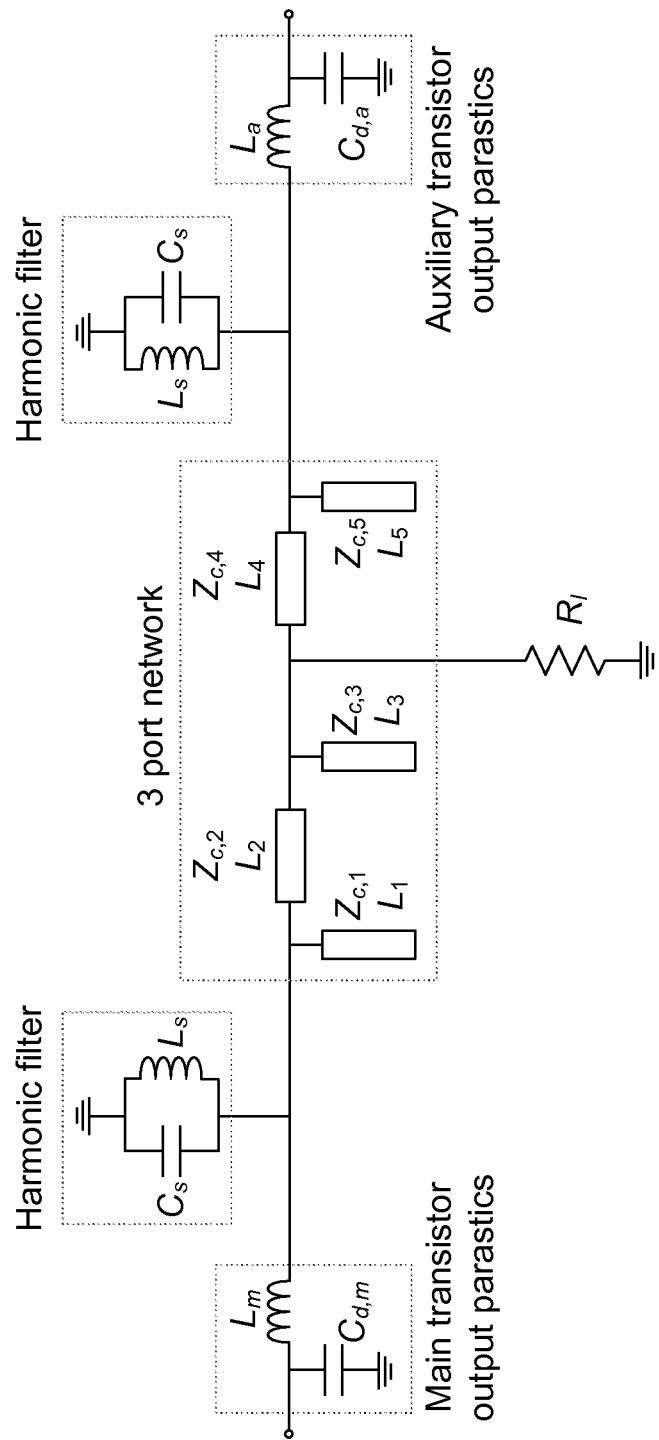
FIG. 7 is an exemplary load network topology for an amplifier arrangement according to an embodiment of the present technique.
Figure 8A:
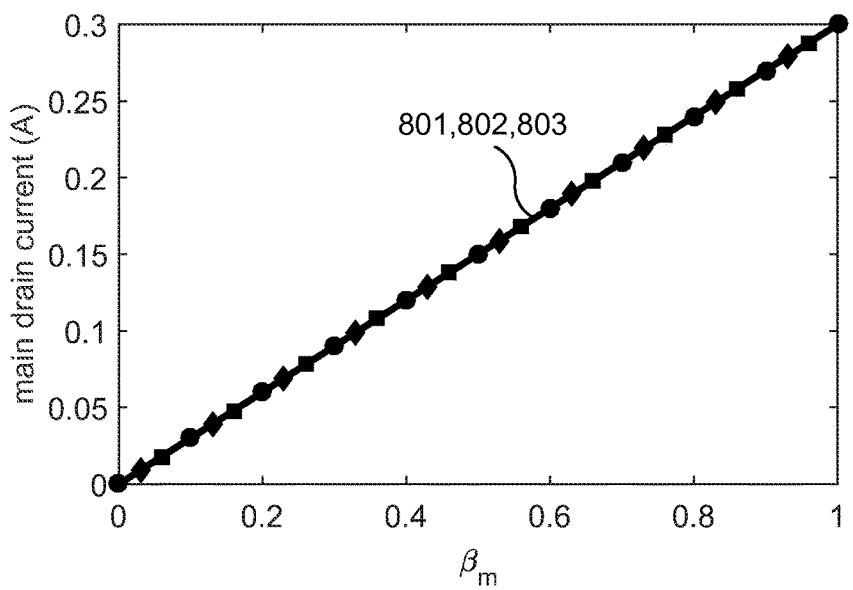
FIGS. 8a-f are graphs schematically illustrating the performance of exemplary amplifier arrangements.
Figure 8B:
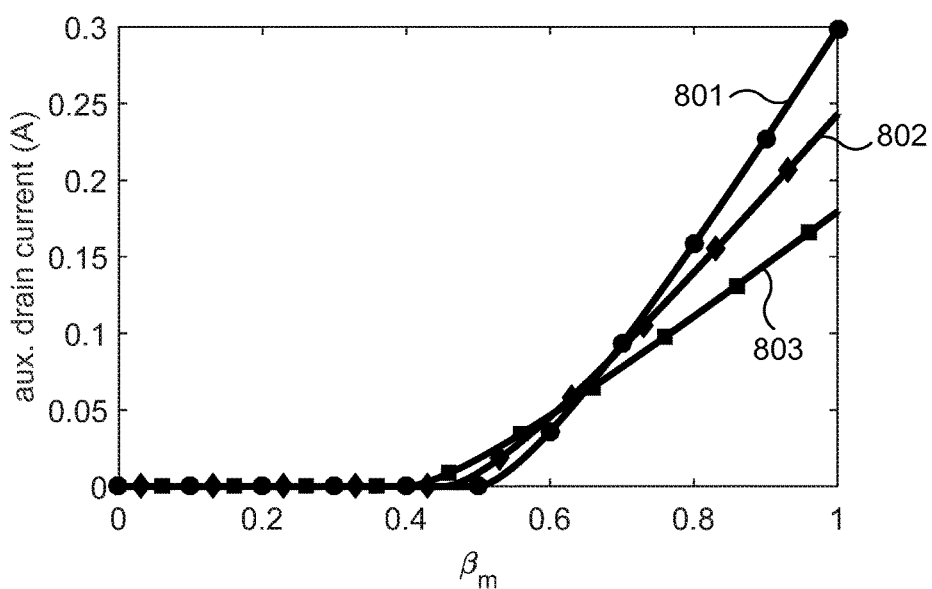
Figure 8C:
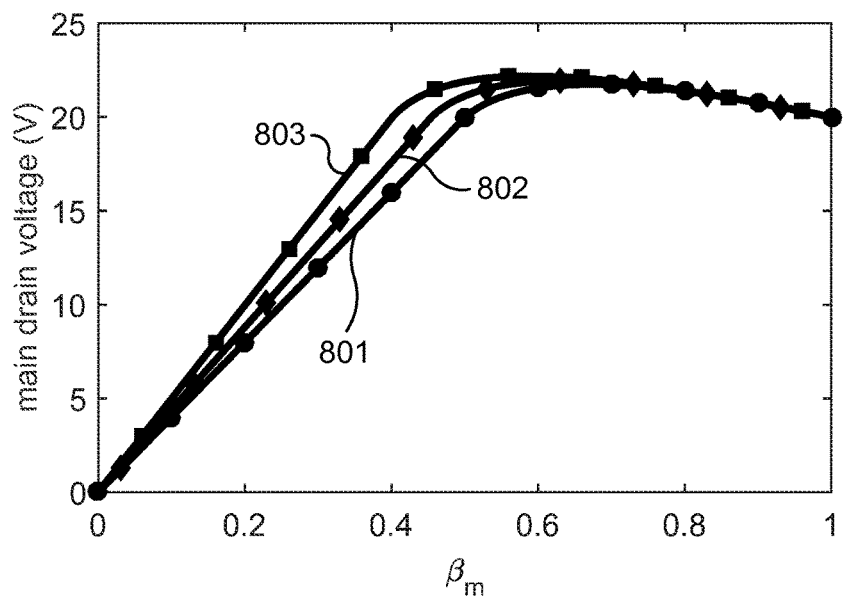
Figure 8D:
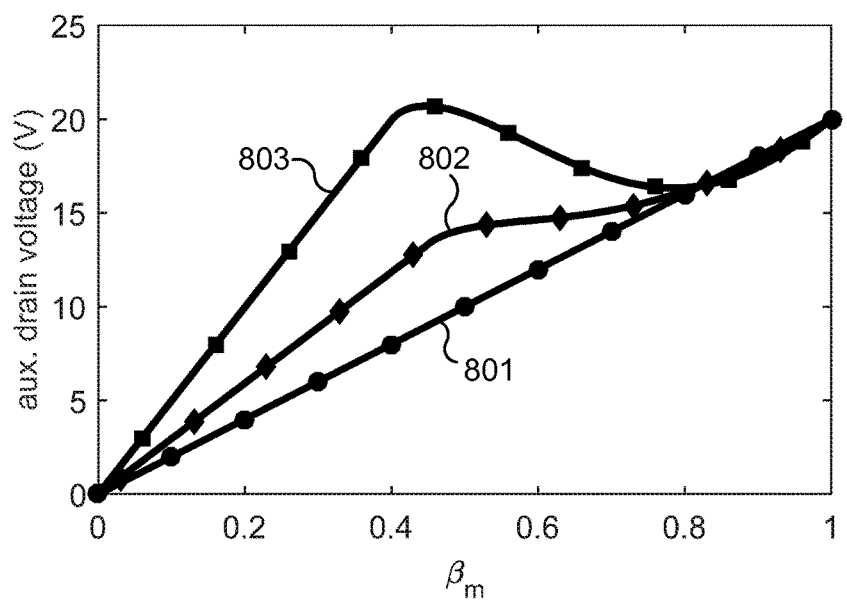
Figure 8E:
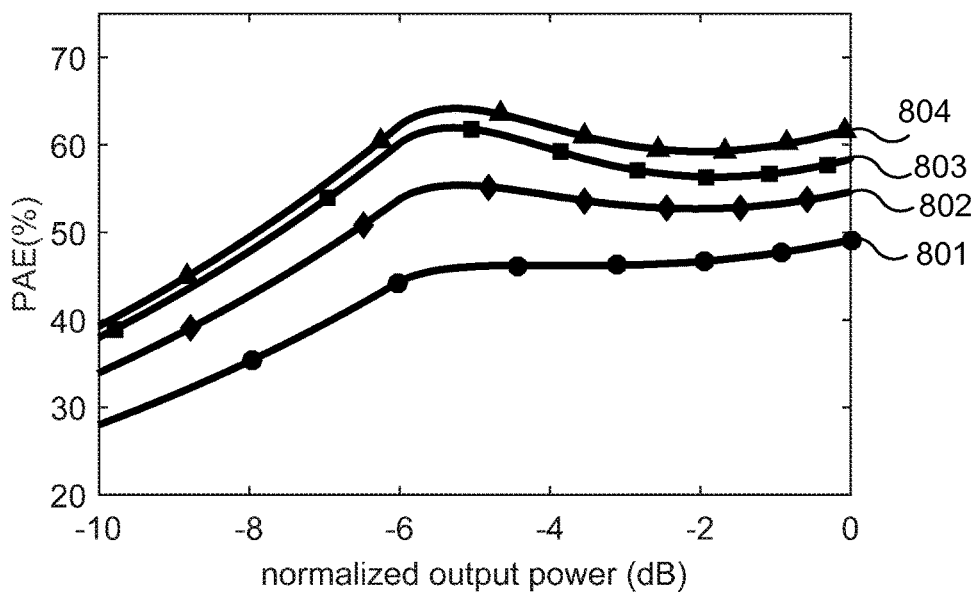
Figure 8F:
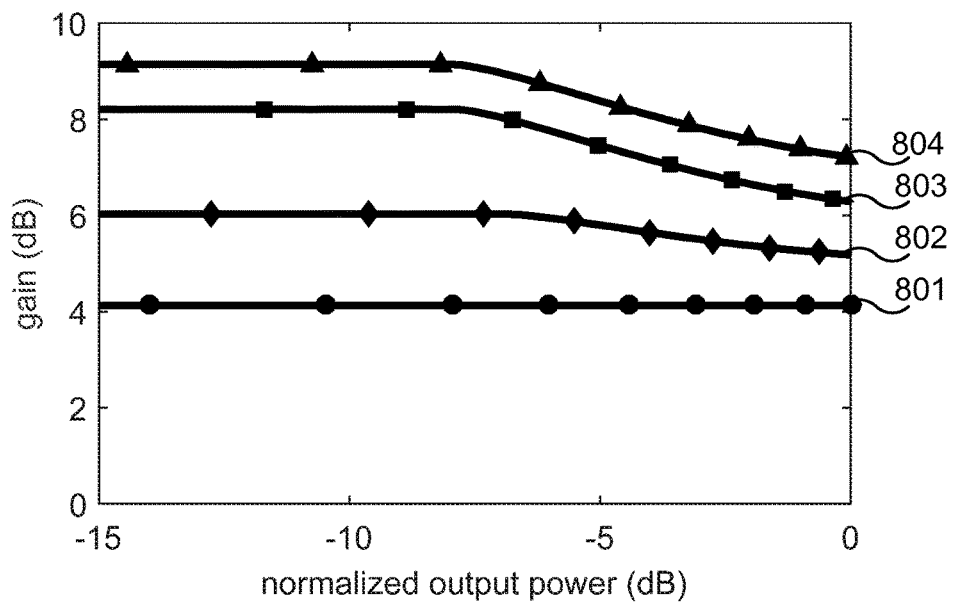

The topology for the load network is realized with two cascaded Π-networks, as illustrated by FIG. 7. The impedance levels and the electrical lengths of the transmission lines are optimized to achieve the best fit versus the calculated Z-parameters. The output parasitics of the transistors can be resonated out in the combiner network. It is important to mention that if it is desired to fit the network parameters over a wide frequency band, other topologies might give better results. The topology may therefore be modified depending on the desired RF bandwidth.

For the simulations presented below, the harmonics are short circuited with a tuned LC resonator, see FIG. 7. It is important to stress that, in a more realistic design case, harmonic terminations, most importantly the second harmonic termination, may be included as a part of the transmission line combiner network.

The performance of the classical DPA, the symmetrical DPA, the smallest possible size DPA and the symmetrical low auxiliary current DPA are plotted in FIGS. 8a-f. The soft turn-on effect of the class-C biased auxiliary transistor causes the drain voltage to be negative for some power levels. This is compensated for by shifting the drain bias slightly. In FIGS. 8a-f, curves related to the "Classical" solution are denoted by 801, "Symmetrical" by 802, "Smallest size" by 803 and "Symmetrical small current" by 804.

The current and voltage profiles for "Symmetrical small current" 804 are exactly the same as for "Smallest size" 803 and are therefore excluded in FIGS. 8a-d.

The gain of the two DPA architectures introduced herein is significantly higher than the classical DPA and the symmetrical DPA. The higher gain results in a large difference in the PAE for the proposed topologies. The symmetrical small current DPA, for example, has 17.9 percentage point higher PAE than the classical DPA, and 8.4 percentage point higher PAE than the symmetrical DPA at 6 dB OPBO.

The PAE improvement is immediately reflected to average PAE results. The average PAE for the different DPA architectures with a 6.7 dB PAPR W-CDMA signal is presented in Table 3 below. The average PAE for the symmetrical small current DPA is 14.5 percentage points higher than the classical DPA, and 7.4 percentage points higher than the symmetrical DPA.

The PUF and asymmetry of the input power splitter, $P_{in,aux}/P_{in,main}$, is also presented in Table 3. The symmetrical small current DPA architecture achieves best average PAE and the most symmetrical input power split, whereas the smallest size DPA achieves highest PUF.

TABLE 3

| DPA Type | $\frac{P_{in,aux}}{P_{in,main}}$ | PUF | Avg. PAE |
| --- | --- | --- | --- |
| Classical | 7.1 dB | 0.110 | 44.1% |
| Symmetrical | 5.3 dB | 0.113 | 51.9% |
| Smallest size | 3.0 dB | 0.117 | 56.6% |
| Symmetrical small aux. current | 1.5 dB | 0.100 | 59.3% |

The general Doherty concept can be converted into a load-pull-based design concept. One example of the design procedure is to first decide γ, the current scaling factor ($r_c$) and oversizing factors ($r_{o,m}$ and $r_{o,a}$). The next step is to divide the input power and select the auxiliary gate bias such that the wanted current profiles are achieved. Then, the transistor optimum impedances at maximum power and back-off should be measured or simulated. At back-off, the turn-off impedance for the auxiliary transistor is measured or simulated. The two port network parameters can thereafter be calculated together with a suitable phase difference between the transistor output currents (θ). Finally, this phase shift is implemented at the transistor inputs, adjusting for possible phase shifts in them. The two port combiner network parameters are found from $$Z_{11}+Z_{12}a_1=Z_{opt,main,max}, \tag{58}$$

$$Z_{22}+Z_{12}/a_1=Z_{opt,aux,max}, \tag{59}$$

$$Z_{11}+Z_{12}a_2=Z_{opt,main,bk}, \tag{60}$$

$$Z_{22}+Z_{12}/a_2=-Z_{aux,off}, \tag{61}$$

where $$\alpha_1 = \frac{I_{out,aux,max}}{I_{out,main,max}}, \tag{62}$$

$$\alpha_2 = \frac{I_{out,aux,bk}}{I_{out,main,bk}}. \tag{63}$$

Here, $a_1$ is measured or simulated. In a realistic transistor, the parameter $a_2$ is non-zero, hence the class-C turn-off impedance will not be infinity and needs to be measured. Note that $a_2$ can be expressed as a function of $Z_{aux,off}$, reducing the equation system to three equations with three unknowns. This is sufficient to make a load-pull based design of the general Doherty concept, where transistor parasitics are accounted for and with the Doherty conditions fulfilled.

A continuous set of solutions that fulfills the Doherty load equations while keeping the utilization of the auxiliary transistor fixed has been introduced. This method of designing DPAs yields several highly interesting solutions such as the smallest possible size DPA and the symmetrical small current DPA.

Both of the two special case solutions, the smallest possible size DPA and the symmetrical small current DPA, present significantly higher gain than previously known DPA architectures. Higher gain enables considerably higher average efficiency for amplitude modulated signals. Moreover, with higher gain, smaller pre-drivers can be used before the final output stage, further improving the overall efficiency of the transmitter.

The generalized Doherty concept yields solutions with higher PUF than previously known DPA architectures. This allows using smaller devices for the same output power level, reducing the device parasitics, which may help improve the RF bandwidth.

The herein presented general Doherty concept opens for a completely new degree of freedom in Doherty PA design. This enables more freedom when making design trade-offs in a technology with limited transistor sizes available.

Both of the two special case solutions, the smallest possible size DPA and the symmetrical small current DPA, present significantly more symmetrical input power splitters than previously known DPA architectures. This is a distinct advantage for practical realization of the splitter.

Figure 9:
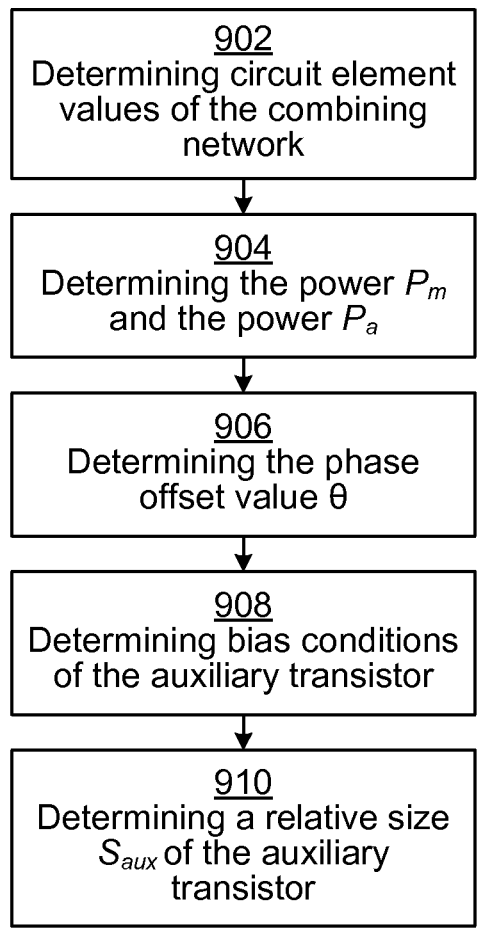
FIG. 9 is a flow-chart outlining the general features of a method according to an embodiment of the present technique.

FIG. 9 is a flow chart outlining the general steps of the method according to the present technique. Once the back-off power level $\gamma$, a current scaling factor $r_c$ of the auxiliary transistor, a main transistor oversizing factor $r_{o,m}$, and an auxiliary transistor oversizing factor $r_{o,a}$, where $r_c<1$, $r_{o,m} \geq 1$ and $r_{o,a} \geq 1$ have been determined, the method involves determining 902 circuit element values of the combining network 902, determining 904 the power $P_m$ and the power $P_a$ 904, determining 906 the phase offset value $\theta$, determining 908 a bias condition of the auxiliary transistor; and determining 910 a relative size $S_{aux}$ of the auxiliary transistor. It should be noted that the above method steps must not be performed in the particular order that they are stated. It is thus equally possible to perform the method by performing the steps in another order than the one stated above.

Even though the invention has been described with reference to specific exemplifying embodiments thereof, many different alterations, modifications and the like will become apparent for those skilled in the art from a study of the drawings, the disclosure, and the appended claims. Also, it should be noted that parts of the amplifier arrangement may be omitted, interchanged or arranged in various ways, the amplifier arrangement yet being able to perform the functionality of the present invention. The mere fact that certain measures are recited in mutually different dependent claims does not indicate that a combination of these measured cannot be used to advantage.

Additionally, variations to the disclosed embodiments can be understood and effected by the skilled person in practicing the claimed invention, In the claims, the word "comprising" does not exclude other elements or steps, and the indefinite article "a" or "an" does not exclude a plurality.

The invention claimed is:

1. An amplifier arrangement for optimizing efficiency at a peak power level and a back-off power level $\gamma$, the amplifier arrangement comprising:
   an input power splitter configured to divide an input signal into a first signal having a power $P_m$ and a second signal having a power $P_a$;
   a main transistor connected to the power splitter and arranged to receive the first signal, the main transistor being configured to operate in a class-B like mode of operation to provide a first output signal;
   an auxiliary transistor connected to the power splitter and arranged to receive the second signal, the auxiliary transistor being configured to operate in a class-C mode of operation to provide a second output signal, wherein the received first and second signals have a phase offset value $\theta$, wherein $-\pi<\theta<\pi$; and; and
   a combining network configured to couple the first and second output signals of the main and auxiliary transistors to an output node of the amplifier arrangement, wherein circuit element values of the combining network, the power $P_m$ and the power $P_a$; the phase offset value $\theta$, a bias condition of the auxiliary transistor; and a relative size $S_{aux}$ of the auxiliary transistor are based on a predetermined back-off power level $\gamma$, a current scaling factor $r_c$ of the auxiliary transistor, a main transistor oversizing factor $r_{o,m}$, and an auxiliary transistor oversizing factor $r_{o,a}$, where $r_c<1$, $r_{o,m} \geq 1$ and $r_{o,a} \geq 1$.

2. The amplifier arrangement of claim 1, wherein the current scaling factor $r_c$ is $$\frac{2}{\gamma+1} \leq r_c < 1,$$

where $\gamma>1$.

3. The amplifier arrangement of claim 1, wherein $S_{aux}=r_{o,a}S/r_{o,m}$, where $S_c$ is a size ratio defined as $$S_c = r_c \frac{\pi}{2} \frac{(\beta_{bk}-1)^2}{\beta_{bk}\left(\cos^{-1}(\beta_{bk}) - \beta_{bk}\sqrt{1-\beta_{bk}^2}\right)},$$

and where $$\beta_{bk} = \frac{\sqrt{4r_c\gamma + (r_c-1)^2} - (r_c-1)}{2\gamma}.$$

4. The amplifier arrangement of claim 3, wherein the phase offset value $\theta$ is $$\theta = \begin{cases} \pm\theta_x \\ \pm(\pi-\theta_x) \end{cases},$$

where $$\theta_x = \tan^{-1}\left(\sqrt{\frac{\beta_{bk}+r_c}{1-r_c}}\right).$$

5. The amplifier arrangement of claim 3, wherein the power splitter is configured to divide an input power $P_{in}$ as $P_m = d_{P,m}P_{in}$, where $$d_{P,m} = \frac{1}{1 + \frac{r_{o,m}}{r_{o,a}} \frac{S_c}{(\beta_{bk}-1)^2}}.$$

6. The amplifier arrangement of claim 3, wherein a gate bias $V_{GS,a}$ of the auxiliary transistor is $$V_{GS,a} = \frac{V_T - \beta_{bk}V_{SAT}U_{V,a}}{1 - \beta_{bk}U_{V,a}},$$

where $V_T$ is the threshold voltage, $V_{SAT}$ is the saturation voltage, and $$U_{V,a} = \frac{1}{\beta_{bk}(1-r_{o,a})+r_{o,a}}.$$

7. The amplifier arrangement of claim 1, wherein the combining network comprises a three port network comprising a first port connected to the output of the main transistor, a second port connected to the output of the auxiliary transistor, and a third port connected to the output node.

8. The amplifier arrangement of claim 7, wherein the circuit element values of the three port network are defined using a two port network model as $$Z_{11} = \frac{r_{o,m}R_{opt,m}}{\beta_{bk}},$$

$$Z_{12} = -\frac{r_{o,m}R_{opt,m}e^{j\theta}}{r_c}, \text{ and}$$

$$Z_{22} = \frac{r_{o,m}R_{opt,m}\beta_{bk}(r_c + e^{j2\theta})}{r_c^2(1-\beta_{bk})},$$

where $R_{opt}$ is the optimum class B load and where $Z_{21}=Z_{12}$.

9. The amplifier arrangement of claim 1, wherein $r_c$, $r_{o,a}$, and $r_{o,m}$ are selected so that $S_{aux}=1$ for a predetermined back-off power level $\gamma$, for $r_{o,m} \geq 1$, $r_{o,a} > 1$.

10. The amplifier arrangement of claim 1, wherein $r_c$, $r_{o,a}$, and $r_{o,m}$ are selected so that $S_{aux}=1$ for a predetermined back-off power level $\gamma$, for $r_{o,m} \geq 1$, $r_{o,a} > 1$.

11. A circuit, comprising:
an amplifier arrangement for optimizing efficiency at a peak power level and a back-off power level $\gamma$, the amplifier arrangement comprising:
an input power splitter configured to divide an input signal into a first signal having a power $P_m$ and a second signal having a power $P_a$;
a main transistor connected to the power splitter and arranged to receive the first signal, the main transistor being configured to operate in a class-B like mode of operation to provide a first output signal;
an auxiliary transistor connected to the power splitter and arranged to receive the second signal, the auxiliary transistor being configured to operate in a class-C mode of operation to provide a second output signal, wherein the received first and second signals have a phase offset value $\theta$, wherein $-\pi < \theta < \pi$; and; and
a combining network configured to couple the first and second output signals of the main and auxiliary transistors to an output node of the amplifier arrangement,
wherein circuit element values of the combining network, the power $P_m$ and the power $P_a$; the phase offset value $\theta$, a bias condition of the auxiliary transistor; and a relative size $S_{aux}$ of the auxiliary transistor are based on a predetermined back-off power level $\gamma$, a current scaling factor $r_c$ of the auxiliary transistor, a main transistor oversizing factor $r_{o,m}$, and an auxiliary transistor oversizing factor $r_{o,a}$, where $r_c < 1$, $r_{o,m} \geq 1$ and $r_{o,a} \geq 1$.

12. A wireless communication device, comprising:
an amplifier arrangement for optimizing efficiency at a peak power level and a back-off power level $\gamma$, the amplifier arrangement comprising:
an input power splitter configured to divide an input signal into a first signal having a power $P_m$ and a second signal having a power $P_a$;
a main transistor connected to the power splitter and arranged to receive the first signal, the main transistor being configured to operate in a class-B like mode of operation to provide a first output signal;
an auxiliary transistor connected to the power splitter and arranged to receive the second signal, the auxiliary transistor being configured to operate in a class-C mode of operation to provide a second output signal, wherein the received first and second signals have a phase offset value $\theta$, wherein $-\pi < \theta < \pi$; and; and
a combining network configured to couple the first and second output signals of the main and auxiliary transistors to an output node of the amplifier arrangement,
wherein circuit element values of the combining network, the power $P_m$ and the power $P_a$; the phase offset value $\theta$, a bias condition of the auxiliary transistor; and a relative size $S_{aux}$ of the auxiliary transistor are based on a predetermined back-off power level $\gamma$, a current scaling factor $r_c$ of the auxiliary transistor, a main transistor oversizing factor $r_{o,m}$, and an auxiliary transistor oversizing factor $r_{o,a}$, where $r_c < 1$, $r_{o,m} \geq 1$ and $r_{o,a} \geq 1$.

13. A method of determining the properties of an amplifier arrangement for optimizing efficiency at a peak power level and a back-off power level $\gamma$;
wherein the amplifier arrangement comprises: a) an input power splitter configured to divide an input signal into a first signal having a power Pm and a second signal having a power Pa; b) a main transistor connected to the power splitter and arranged to receive the first signal, the main transistor being configured to operate in a class-B like mode of operation to provide a first output signal; c) an auxiliary transistor connected to the power splitter and arranged to receive the second signal, the auxiliary transistor being configured to operate in a class-C mode of operation to provide a second output signal,
wherein the received first and second signals have a phase offset value $\theta$, wherein $-\pi < \theta < \pi$; and d) a combining network configured to couple the first and second output signals of the main and auxiliary transistors to an output node of the amplifier arrangement, the method comprising:
determining circuit element values of the combining network;
determining the power $P_m$ and the power $P_a$;
determining the phase offset value $\theta$;
determining bias conditions of the auxiliary transistor; and
determining a relative size $S_{aux}$ of the auxiliary transistor; based on a selected back off power level $\gamma$, a current scaling factor $r_c$ and a main transistor oversizing factor $r_{o,m}$, and an auxiliary transistor oversizing factor $r_{o,a}$, where $r_c < 1$, $r_{o,m} \geq 1$ and $r_{o,a} \geq 1$.

14. The method of claim 13, further comprising selecting the current scaling factor $r_c$ as $$\frac{2}{\gamma+1} \le r_c < 1,$$

where $\gamma>1$.

15. The method of claim 13, further comprising determining $S_{aux}$ as $S_{aux}=r_{o,a}S_c r_{o,m}$, where $S_c$ is a size ratio defined as $$S_c = r_c \frac{\pi}{2} \frac{(\beta_{bk}-1)^2}{\beta_{bk}\left(\cos^{-1}(\beta_{bk}) - \beta_{bk}\sqrt{1-\beta_{bk}^2}\right)},$$

and where $$\beta_{bk} = \frac{\sqrt{4r_c\gamma + (r_c-1)^2} - (r_c-1)}{2\gamma}.$$

16. The method of claim 15, wherein the phase offset value $\theta$ is selected as $$\theta = \begin{cases} \pm \theta_x \\ \pm(\pi - \theta_x) \end{cases},$$

where $$\theta_x = \tan^{-1}\left(\sqrt{\frac{\beta_{bk}+r_c}{1-r_c}}\right).$$

17. The method of claim 15, wherein the power splitter is configured to divide an input power $P_{in}$ as $P_m = d_{P,m}P_{in}$, where $$d_{P,m} = \frac{1}{1 + \frac{r_{o,m}}{r_{o,a}}\frac{S_c}{(\beta_{bk}-1)^2}}.$$

18. The method of claim 15, wherein a gate bias $V_{GS,a}$ of the auxiliary transistor is selected as $$V_{GS,a} = \frac{V_T - \beta_{bk}V_{SAT}U_{V,a}}{1 - \beta_{bk}U_{V,a}},$$

where $V_T$ is the threshold voltage, $V_{SAT}$ is the saturation voltage, and $$U_{V,a} = \frac{1}{\beta_{bk}(1-r_{o,a})+r_{o,a}}.$$

19. The method of claim 13, wherein the combining network comprises a three port network comprising a first port connected to the output of the main transistor, a second port connected to the output of the auxiliary transistor, and a third port connected to the output node.

20. The method of claim 19, wherein the circuit element values of the three port network are determined using a two port network model as $$Z_{11} = \frac{r_{o,m}R_{opt,m}}{\beta_{bk}},$$

$$Z_{12} = -\frac{r_{o,m}R_{opt,m}e^{j\theta}}{r_c}, \text{ and}$$

$$Z_{22} = \frac{r_{o,m}R_{opt,m}\beta_{bk}(r_c + e^{j2\theta})}{r_c^2(1-\beta_{bk})},$$

where $R_{opt}$ is the optimum class B load and where $Z_{21}=Z_{12}$.

21. The method of claim 13, wherein $r_c$, $r_{o,a}$ and $r_{o,m}$ are selected so that $S_{aux}=1$ for a selected back-off power level $\gamma$, for $r_{o,m}>1$, $r_{o,a}\ge 1$.

22. The method of claim 13, wherein $r_c$, $r_{o,a}$ and $r_{o,m}$ are selected so that $S_{aux}=1$ for a selected back-off power level $\gamma$, for $r_{o,m}\ge 1$, $r_{o,a}>1$.

23. A computer program product stored in a non-transitory computer readable medium for determining the properties of an amplifier arrangement for optimizing efficiency at a peak power level and a back-off power level $\gamma$; wherein the amplifier arrangement comprises: a) an input power splitter configured to divide an input signal into a first signal having a power Pm and a second signal having a power $P_a$; b) a main transistor connected to the power splitter and arranged to receive the first signal, the main transistor being configured to operate in a class-B like mode of operation to provide a first output signal; c) an auxiliary transistor connected to the power splitter and arranged to receive the second signal, the auxiliary transistor being configured to operate in a class-C mode of operation to provide a second output signal, wherein the received first and second signals have a phase offset value $\theta$, wherein $-\pi<\theta<\pi$; and d) a combining network configured to couple the first and second output signals of the main and auxiliary transistors to an output node of the amplifier arrangement, the computer program product comprising software instructions which, when run on one or more processors of a determining circuit, causes the determining circuit to:

determine circuit element values of the combining network;

determine the power $P_m$ and the power $P_a$;

determine the phase offset value $\theta$;

determine bias conditions of the auxiliary transistor; and determine a relative size $S_{aux}$ of the auxiliary transistor; based on a selected back-off power level $\gamma$, a current scaling factor $r_c$ and a main transistor oversizing factor $r_{o,m}$, and an auxiliary transistor oversizing factor $r_{o,a}$, where $r_c<1$, $r_{o,m}\ge 1$ and $r_{o,a}\ge 1$.

* * * * *

UNITED STATES PATENT AND TRADEMARK OFFICE
CERTIFICATE OF CORRECTION

| | | |
|---|---|---|
| PATENT NO. | : 9,614,479 B2 | Page 1 of 3 |
| APPLICATION NO. | : 14/759528 | |
| DATED | : April 4, 2017 | |
| INVENTOR(S) | : Hallberg et al. | |

It is certified that error appears in the above-identified patent and that said Letters Patent is hereby corrected as shown below:

On the Title Page

Below Item (86), insert Item (87):
-- PCT Pub. No.: WO2017/001004
PCT Pub. Date: January 5, 2017 --.

In the Specification

In Column 8, Line 34, in Equation (4), delete "$v_{GS} = V_{GS,DC} + v_{gs} = V_{GS,DC} + \beta V_{gs,max} \sin(\omega_o t),$" and insert -- $v_{GS} = V_{GS,DC} + v_{gs} = V_{GS,DC} + \beta V_{gs,max} \sin(\omega_o t),$ --, therefor.

In Column 10, Line 22, delete "FIGS. 2-c," and insert -- FIGS. 2a-c, --, therefor.

In Column 10, Lines 50-52, in Equation (19), delete "$S_c = r_c \frac{\pi}{2} \frac{(\beta_{bk} - 1)^2}{\beta_{bk}\left(\cos^{-1}(\beta_{bk}) - \beta_{bk}\sqrt{1 - \beta_{bk}^2}\right)},$" and insert -- $S_c = r_c \frac{\pi}{2} \frac{(\beta_{bk} - 1)^2}{\beta_{bk}\left(\cos^{-1}(\beta_{bk}) - \beta_{bk}\sqrt{1 - \beta_{bk}^2}\right)}.$ --, therefor.

In Column 11, Lines 24-25, in Equation (25), delete "$P_{out,a} = 0.5 V_{DS}|I_a|,$" and insert -- $P_{out,a} = 0.5 V_{DS}|I_a|,$ --, therefor.

Signed and Sealed this
Twenty-second Day of May, 2018

Andrei Iancu
*Director of the United States Patent and Trademark Office*

CERTIFICATE OF CORRECTION (continued)
U.S. Pat. No. 9,614,479 B2

In Column 11, Lines 38-40, in Equation (27), delete "$\beta_{bk} = \frac{\sqrt{4r_c\gamma + (r_c - 1)^2} - (r_c - 1)}{2\gamma}.$" and insert -- $\beta_{bk} = \frac{\sqrt{4r_c\gamma + (r_c - 1)^2} - (r_c - 1)}{2\gamma}.$ --, therefor.

In Column 12, Line 25, in Equation (35), delete "$P_a = |I_{gs,a}|^2 r_{g,a} = |V_{gs,a}|^2 (\omega_0 C_{gs,a})^2 r_{g,a}.$" and insert -- $P_a = |I_{gs,a}|^2 r_{g,a} = |V_{gs,a}|^2 (\omega_0 C_{gs,a})^2 r_{g,a}.$ --, therefor.

In Column 15, Line 43, delete "$R_{opt,m}0.45$," and insert -- $R_{opt,m}/0.45$, --, therefor.

In Column 15, Line 61, delete "ha a" and insert -- has a --, therefor.

In Column 16, Line 36, delete "Trough" and insert -- Through --, therefor.

In Column 17, Line 58, delete "W -CDMA" and insert -- WCDMA --, therefor.

In Column 18, Line 26, in Equation (58), delete "$Z_{11} + Z_{12}\alpha_1 = Z_{opt,main,max},$" and insert -- $Z_{11} + Z_{12}\alpha_1 = Z_{opt,main,max},$ --, therefor.

In Column 18, Line 28, in Equation (59), delete "$Z_{22} + Z_{12}/\alpha_1 = Z_{opt,aux,max},$" and insert -- $Z_{22} + Z_{12}/\alpha_1 = Z_{opt,aux,max},$ --, therefor.

In Column 18, Line 30, in Equation (60), delete "$Z_{11} + Z_{12}\alpha_2 = Z_{opt,main,bk},$" and insert -- $Z_{11} + Z_{12}\alpha_2 = Z_{opt,main,bk},$ --, therefor.

In Column 18, Line 32, in Equation (61), delete "$Z_{22} + Z_{12}/\alpha_2 = -Z_{aux,off},$" and insert -- $Z_{22} + Z_{12}/\alpha_2 = -Z_{aux,off},$ --, therefor.

In Column 18, Line 43, delete "a₁" and insert -- $\alpha_1$ --, therefor.

In Column 18, Line 44, delete "a₂" and insert -- $\alpha_2$ --, therefor.

In Column 18, Line 46, delete "a₂" and insert -- $\alpha_2$ --, therefor.

In Column 19, Line 42, delete "invention, In" and insert -- invention. In --, therefor.

In the Claims

In Column 19, Line 61, in Claim 1, delete "and; and" and insert -- and --, therefor.

In Column 20, Lines 17-18, in Claim 3, delete "$S_{aux} = r_{o,a} S / r_{o,m}$," and insert -- $S_{aux} = r_{o,a} S_c / r_{o,m}$, --, therefor.

In Column 21, Lines 52-53, in Claim 11, delete "and; and" and insert -- and --, therefor.

In Column 22, Lines 18-19, in Claim 12, delete "and; and" and insert -- and --, therefor.

In Column 22, Line 64, in Claim 13, delete "back off" and insert -- back-off --, therefor.

In Column 23, Line 10, in Claim 15, delete "$S_{aux} = r_{o,a} S_c r_{o,m}$," and insert -- $S_{aux} = r_{o,a} S_c / r_{o,m}$, --, therefor.